US012631963B2

(12) United States Patent
Yamagata et al.

(10) Patent No.: US 12,631,963 B2
(45) Date of Patent: May 19, 2026

(54) METHOD FOR PRODUCING HOLLOW PACKAGE AND METHOD FOR PROVIDING PHOTOSENSITIVE COMPOSITION

(71) Applicant: TOKYO OHKA KOGYO CO., LTD., Kawasaki (JP)

(72) Inventors: Kenichi Yamagata, Kawasaki (JP); Takahiro Kondo, Kawasaki (JP); Hiroaki Takeuchi, Kawasaki (JP); Hirofumi Imai, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 466 days.

(21) Appl. No.: 18/250,337

(22) PCT Filed: Nov. 18, 2021

(86) PCT No.: PCT/JP2021/042389

§ 371 (c)(1),
(2) Date: Apr. 24, 2023

(87) PCT Pub. No.: WO2022/107840

PCT Pub. Date: May 27, 2022

(65) Prior Publication Data

US 2024/0036467 A1 Feb. 1, 2024

(30) Foreign Application Priority Data

Nov. 19, 2020 (JP) ................................ 2020-192768

(51) Int. Cl.

| | |
|---|---|
| ***G03F 7/038*** | (2006.01) |
| ***C07F 5/02*** | (2006.01) |
| ***C07F 9/52*** | (2006.01) |

(52) U.S. Cl.
CPC ................ *G03F 7/038* (2013.01); *C07F 5/02* (2013.01); *C07F 9/52* (2013.01)

(58) Field of Classification Search
CPC ....................................................... G03F 7/038
See application file for complete search history.

(56) References Cited

U.S. PATENT DOCUMENTS

2013/0108961 A1 5/2013 Oonishi et al.
2014/0186765 A1* 7/2014 Oonishi ................ C08G 59/42 430/280.1

(Continued)

FOREIGN PATENT DOCUMENTS

JP 2010-145522 † 7/2010
JP 2010145522 A * 7/2010

(Continued)

*Primary Examiner* — Chanceity N Robinson
(74) *Attorney, Agent, or Firm* — Knobbe, Martens, Olson & Bear, LLP

(57) ABSTRACT

A method for producing a hollow package, including forming a side wall on a substrate having an aluminum wire, and forming a top plate portion on the side wall to prepare a hollow structure accommodating the aluminum wire, in which the photosensitive composition that forms the side wall and/or the top plate portion contains an anion represented by General Formula (I1-an) in which A represents a heteroatom, X represents a halogen atom, R represents a monovalent organic group, k represents an integer of 1 to 6, m represents an integer of 0 to 5, n represents an integer of 1 to 3, and m/(k+m) is 0 or greater and less than 0.7.

$$[(R \rightarrow_{k} A \leftarrow X)_{m}]^{n-}. \tag{I1-an}$$

10 Claims, 3 Drawing Sheets

(56) References Cited

U.S. PATENT DOCUMENTS

| | | | | |
|---|---|---|---|---|
| 2019/0235380 | A1 | 8/2019 | Nakamura et al. | |
| 2021/0124265 | A1* | 4/2021 | Hakone .............. | C08K 5/34926 |
| 2021/0271165 | A1 | 9/2021 | Koumoto et al. | |
| 2022/0068737 | A1 | 3/2022 | Naito et al. | |

FOREIGN PATENT DOCUMENTS

| | | | | | |
|---|---|---|---|---|---|
| JP | 2012-209817 | A | | 10/2012 | |
| JP | 2018013807 | A | * | 1/2018 | |
| JP | 2018-036533 | A | | 3/2018 | |
| WO | WO 2009/151050 | A1 | | 12/2009 | |
| WO | WO 2012/008472 | A1 | | 1/2012 | |
| WO | WO2012008472 | | † | 1/2012 | |
| WO | WO 2013/018635 | A1 | | 2/2013 | |
| WO | WO2018194154 | | † | 10/2018 | |
| WO | WO-2018194154 | A1 | * | 10/2018 | ............. G03F 7/038 |
| WO | WO 2019/156154 | A1 | | 8/2019 | |
| WO | WO2019156154 | | † | 8/2019 | |
| WO | WO 2020/137610 | A1 | | 7/2020 | |

* cited by examiner
† cited by third party

EXAMPLE 3 COMPARATIVE EXAMPLE 1

EXAMPLE 6 COMPARATIVE EXAMPLE 2

METHOD FOR PRODUCING HOLLOW PACKAGE AND METHOD FOR PROVIDING PHOTOSENSITIVE COMPOSITION

TECHNICAL FIELD

The present invention relates to a method for producing a hollow package and a method for providing a photosensitive composition.

Priority is claimed on Japanese Patent Application No. 2020-192768, filed on Nov. 19, 2020, the content of which is incorporated herein by reference.

BACKGROUND ART

A hollow package that seals an electronic device using a surface acoustic wave (SAW) filter has a hollow structure for ensuring propagation of surface acoustic waves and mobility of a movable member of the electronic device (Patent Document 1).

The hollow package is formed by molding a hollow structure in a state where the upper space of a wiring board on which electrodes have been formed is maintained hollow, with a photosensitive material. Patent Document 2 describes that an aluminum alloy is used as an SAW filter in a hollow structure.

CITATION LIST

Patent Documents

[Patent Document 1]
PCT International Publication No. WO2020/137610
[Patent Document 2]
Japanese Unexamined Patent Application, First Publication No. 2012-209817

SUMMARY OF INVENTION

Technical Problem

However, as a result of examination conducted by the present inventors, it has been found that in a case where a hollow structure actually includes an aluminum wire formed of an aluminum alloy, the aluminum wire may corrode.

Therefore, the present invention has been made in view of the above-described circumstances, and an object thereof is to provide a method for producing a hollow package and a method for providing a photosensitive composition, in which corrosion of an aluminum wire constituting a hollow package can be suppressed.

Solution to Problem

In order to achieve the above-described object, the present invention employs the following configuration.

According to a first aspect of the present invention, there is provided a method for producing a hollow package which includes a substrate having an aluminum wire, and a hollow structure accommodating the aluminum wire on the substrate, the method including: a step of forming a side wall that surrounds the aluminum wire on the substrate having the aluminum wire; and a step of forming a top plate portion on the side wall to prepare the hollow structure accommodating the aluminum wire, in which the side wall and/or the top plate portion is formed of a photosensitive composition, the photosensitive composition contains a cationic polymerization initiator consisting of a cationic moiety and an anionic moiety, and the anionic moiety contains an anion represented by General Formula (I1-an).

[Chemical Formula 1]

$$[(R \rightarrow_{k} A \leftarrow X)_{m}]^{n-} \qquad \text{(I1-an)}$$

[In the formula, A represents a heteroatom selected from the group consisting of boron, aluminum, gallium, phosphorus, arsenic, antimony, and bismuth, X represents a halogen atom, R represents a monovalent organic group, k represents an integer of 1 to 6, where a plurality of R's may be linked to each other to form a divalent or higher valent organic group coordinated to A in a case where k represents 2 or greater, m represents an integer of 0 to 5, n represents an integer of 1 to 3, and m/(k+m) is 0 or greater and less than 0.7.]

According to a second aspect of the present invention, there is provided a method for providing a photosensitive composition, including: providing the photosensitive composition to a process line for carrying out the method for producing a hollow package according to the first aspect.

Advantageous Effects of Invention

According to the aspects of this invention, it is possible to provide a method for producing a hollow package and a method for providing a photosensitive composition, in which corrosion of an aluminum wire constituting a hollow package can be suppressed.

DESCRIPTION OF EMBODIMENTS

In the present specification and the scope of the present patent claims, the term "aliphatic" is a relative concept used in relation to the term "aromatic", and denotes a group, a compound, or the like that has no aromaticity.

The term "alkyl group" includes a linear, branched chain-like, or cyclic monovalent saturated hydrocarbon group unless otherwise specified. The same applies to the alkyl group in an alkoxy group.

The term "alkylene group" includes a linear, branched chain-like, or cyclic divalent saturated hydrocarbon group unless otherwise specified.

The term "halogenated alkyl group" denotes a group in which some or all hydrogen atoms of an alkyl group have been substituted with halogen atoms. Examples of the halogen atom include a fluorine atom, a chlorine atom, a bromine atom, and an iodine atom.

The term "fluorinated alkyl group" denotes a group in which some or all hydrogen atoms of an alkyl group have been substituted with fluorine atoms.

The term "constitutional unit" indicates a monomer unit constituting a polymer compound (a resin, a polymer, or a copolymer).

The expression "may have a substituent" includes both a case where a hydrogen atom (—H) is substituted with a monovalent group and a case where a methylene ($—CH_2—$) group is substituted with a divalent group.

The term "light exposure" is a general concept for irradiation with radiation.

(Method for Producing Hollow Package)

A method for producing a hollow package according to the present embodiment is a method for producing a hollow package which includes a substrate having an aluminum wire and a hollow structure accommodating the aluminum wire on the substrate, the method including a step of forming a side wall that surrounds the aluminum wire on the substrate having the aluminum wire, and a step of forming a top plate portion on the side wall to prepare the hollow structure accommodating the aluminum wire, in which the side wall and/or the top plate portion is formed of a specific photosensitive composition.

Specifically, the method for producing a hollow package according to an embodiment includes a step (first step (S1)) of forming a side wall that surrounds the aluminum wire on the substrate having the aluminum wire and a step (second step (S2)) of forming a top plate portion on the side wall to prepare the hollow structure accommodating the aluminum wire.

Hereinafter, an embodiment of the method for producing a hollow package in which the side wall and the top plate portion are formed of the photosensitive composition will be described with reference to FIGS. 1 and 2.

Figure 1:
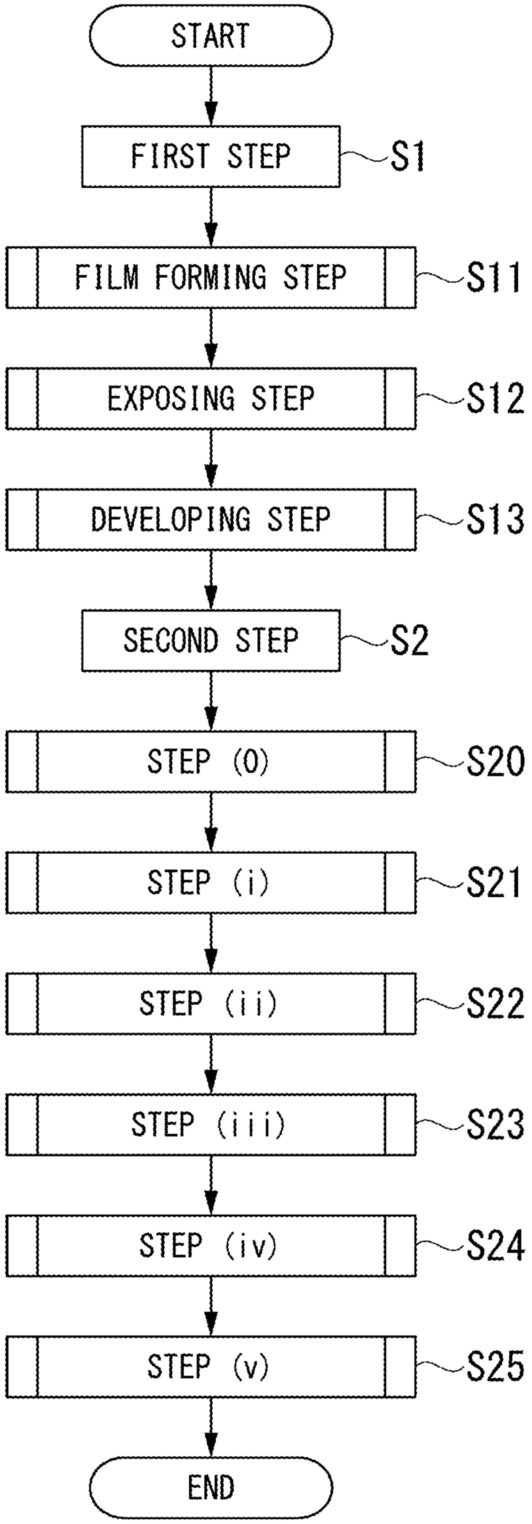
FIG. 1 is a flowchart showing a method for producing a hollow package according to an embodiment of the present invention.

FIG. 1 is a flowchart showing the method for producing a hollow package according to the embodiment of the present invention.

Figure 2:
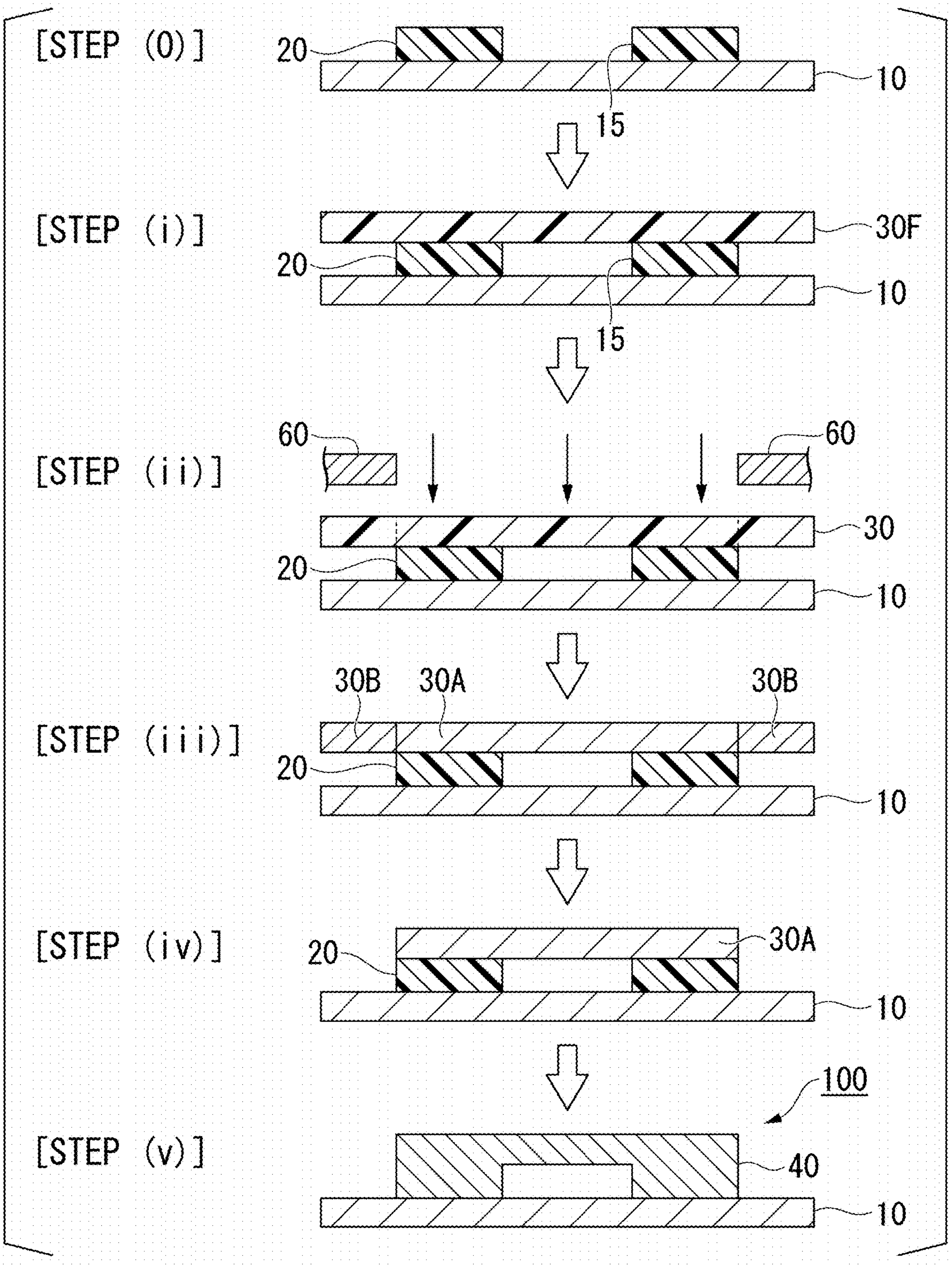
FIG. 2 is a schematic view showing the method for producing a hollow package according to the embodiment of the present invention.

FIG. 2 is a schematic view describing the second step (S2) described below, in the method for producing a hollow package according to the embodiment.

[First Step]: S1

In the first step of the present embodiment, a side wall 20 that surrounds an aluminum wire is formed on a substrate 10 having the aluminum wire.

The first step S1 of the present embodiment includes a film forming step S11, an exposing step S12, and a developing step S13 and can be performed as follows.

[[Film Forming Step]]: S11

First, a support (substrate 10) is coated with the photosensitive composition described below by a known method such as a spin coating method, a roll coating method, or a screen printing method and subjected to a baking treatment (post-apply bake (PAB)) under a temperature condition of 50° C. to 150° C. for 2 to 60 minutes to form a photosensitive resin film.

The support (substrate 10) is not particularly limited and a known support of the related art can be used, and examples thereof include a substrate for an electronic component and a substrate on which a predetermined wiring pattern has been formed. More specific examples thereof include a metal substrate such as silicon, silicon nitride, titanium, tantalum, lithium tantalate ($LiTaO_3$), niobium, lithium niobate ($LiNbO_3$), palladium, titanium tungsten, copper, chromium, iron, or aluminum, and a glass substrate. As the materials of the wiring pattern, copper, aluminum, nickel, or gold can be used.

In the present embodiment, the aluminum wire is used for the wiring pattern. The concept of "aluminum wire" includes not only a wire consisting of an aluminum alloy, but also a wire consisting of an alloy of aluminum and other metals. It is preferable to use an aluminum alloy, an aluminum-copper alloy, or the like as an alloy constituting a wire that can be used as the aluminum wire.

The film thickness of the photosensitive resin film formed of the photosensitive composition is not particularly limited, but is preferably in a range of 10 to 100 μm.

[[Exposing Step]]: S12

Next, the formed photosensitive resin film is selectively exposed using a known exposure device by being exposed via a mask (mask pattern) on which a predetermined pattern has been formed or by being irradiated directly with electron beams without a mask pattern for drawing or the like.

After the selective exposure is performed, a baking (post-exposure bake (PEB)) treatment is performed as necessary, for example, under a temperature condition of 80° C. to 150° C. for 40 to 1200 seconds, preferably 40 to 1000 seconds, and more preferably 60 to 900 seconds.

The wavelength used for the exposure is not particularly limited, and radiation such as ultraviolet rays having a wavelength of 300 to 500 nm, i-rays (wavelength of 365 nm), or visible rays is used for selective irradiation (exposure). A low-pressure mercury lamp, a high-pressure mercury lamp, an ultra-high pressure mercury lamp, a metal halide lamp, an argon gas laser, or the like can be used as a source of the radiation described above.

The radiation here denotes ultraviolet rays, visible rays, far ultraviolet rays, X-rays, electron beams, or the like. The radiation amount of radiation varies depending on the type and blending amount of each component in the composition, the film thickness of the coating film, and the like, and is in a range of 100 to 2000 $mJ/cm^2$, for example, in a case of using an ultra-high pressure mercury lamp.

The method of exposing the photosensitive resin film may be performed by general exposure (dry exposure) conducted in air or an inert gas such as nitrogen or by liquid immersion exposure (liquid immersion lithography).

The photosensitive resin film after the exposing step has high transparency and, for example, the haze value of the photosensitive resin film in a case of being irradiated with i-line (wavelength of 365 nm) is preferably 3% or less and more preferably in a range of 1.0% to 2.7%.

In this manner, the photosensitive resin film formed of the photosensitive composition according to the embodiment described above has high transparency. Therefore, in a case of exposure for pattern formation, the light transmittance increases, and thus a negative tone pattern with satisfactory lithography characteristics is likely to be obtained.

The haze value of the photosensitive resin film after the exposing step is measured by a method in conformity with JIS K 7136 (2000).

[[Developing Step]]: S13

Next, the exposed photosensitive resin film is developed with a developing solution containing an organic solvent (organic developing solution). After the development, it is preferable to perform a rinse treatment. A baking treatment (post-bake) may be performed as necessary.

The organic solvent contained in the organic developing solution may be obtained by dissolving a component (A) (component (A) before exposure) and can be appropriately selected from known organic solvents. Specific examples thereof include a polar solvent such as a ketone-based solvent, an ester-based solvent, an alcohol-based solvent, a nitrile-based solvent, an amide-based solvent, and an ether-based solvent, and a hydrocarbon solvent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, γ-butyrolactone, and methyl amyl ketone (2-heptanone). Among these examples, methyl amyl ketone (2-heptanone) is preferable as the ketone-based solvent.

Examples of the ester-based solvent include methyl acetate, butyl acetate, ethyl acetate, isopropyl acetate, amyl acetate, isoamyl acetate, ethyl methoxy acetate, ethyl ethoxy acetate, propylene glycol monomethyl ether acetate (PGMEA), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate or PGMEA is preferable as the ester-based solvent.

Examples of the nitrile-based solvent include acetonitrile, propionitrile, valeronitrile, and butyronitrile.

Known additives can be blended into the organic developing solution as desired. Examples of the additive include a surfactant. The surfactant is not particularly limited, and for example, an ionic or non-ionic fluorine-based and/or silicon-based surfactant can be used.

As the surfactant, a non-ionic surfactant is preferable, and a non-ionic fluorine-based surfactant or a non-ionic silicon-based surfactant is more preferable.

In a case where a surfactant is blended into the solution, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be performed by a known developing method, and examples thereof include a method of immersing a support in a developing solution for a certain time (a dip method), a method of raising a developing solution on the surface of a support using the surface tension and maintaining the state for a certain time (a puddle method), a method of spraying a developing solution to the surface of a support (spray method), and a method of continuously ejecting a developing solution onto a support rotating at a certain rate while scanning a developing solution ejection nozzle at a certain rate (dynamic dispense method).

The rinse treatment carried out using a rinse solution (washing treatment) can be performed according to a known rinse method. Examples of the method of performing the rinse treatment include a method of continuously ejecting a rinse solution onto a support rotating at a certain rate (rotary coating method), a method of immersing a support in a rinse solution for a certain time (dip method), and a method of spraying a rinse solution to the surface of a support (spray method).

It is preferable that the rinse treatment is performed with a rinse solution containing an organic solvent.

The side wall 20 surrounding the aluminum wire can be formed on the substrate having the aluminum wire by performing the film forming step, the exposing step, and the developing step described above. The substrate 10, on which the side wall 20 has been formed, obtained in the first step corresponds to the substrate shown in [Step (0)] of FIG. 2. As shown in [Step (0)] of FIG. 2, the side wall 20 surrounding the aluminum wire and the substrate 10 form a recessed portion 15.

[Second Step]: S2

In the second step of the present embodiment, an exposed portion 30A serving as the top plate portion is formed on the side wall 20 formed in the first step to prepare the hollow structure accommodating the aluminum wire.

The second step in the present embodiment includes the following step (0), step (i), step (ii), step (iii), step (iv), and step (v).

Step (0): A step of preparing the substrate 10, on which the side wall 20 has been formed, obtained in the first step and a photosensitive resist film 30F including the photosensitive resin film 30

Step (i): A step of disposing the photosensitive resist film 30F such that the photosensitive resist film 30F blocks an opening surface of the recessed portion 15 formed by the side wall 20 surrounding the aluminum wire and the substrate 10 and peeling the base film off from the photosensitive resin film 30 constituting the photosensitive resist film 30F Step (ii): A step of exposing the photosensitive resin film 30 after the step (i)

Step (iii): A step of performing a heat treatment on the photosensitive resin film after the step (ii)

Step (iv): A step of developing the photosensitive resin film 30 after the step (iii) to form a negative tone pattern (exposed portion 30A) in which the opening surface of the recessed portion 15 formed by the side wall 20 formed in the first step and the substrate 10

Step (v): A step of further performing a heat treatment on the negative tone pattern (exposed portion 30A) after the step (iv) so that the pattern is cured, to obtain a hollow structure 100 in which the exposed portion 30A serving as the top plate portion consists of a cured body 40 of the photosensitive resin film

[[Step (0)]]: S20

In the step (0) of the present embodiment, the substrate 10, on which the side wall 20 has been formed, obtained in the first step and the photosensitive resist film 30F including the photosensitive resin film are prepared.

In FIG. 2, the substrate 10 and the side wall 20 formed on the substrate 10 constitute a substrate having the recessed portion 15 in the surface thereof.

<<Regarding Photosensitive Resist Film>>

The photosensitive resist film 30F of the present embodiment includes, for example, the negative tone photosensitive resin film 30 containing an epoxy group-containing resin (component (A)) and a cationic polymerization initiator (component (I)). The photosensitive resin film 30 can be formed of a negative tone photosensitive composition described below.

The photosensitive resin film 30 constituting the exposed portion 30A serving as the top plate portion may be formed of a material that is the same as or different from the photosensitive resin material forming the side wall 20.

In a case where the photosensitive resin film 30 is formed by using such a photosensitive resist film 30F and selectively exposed, since an acid is generated from the component (I), an epoxy group in the component (A) undergoes ring-opening polymerization due to an action of the acid, and thus the solubility of the component (A) in a developing solution containing an organic solvent decreases in the exposed portion of the photosensitive resin film 30 while the solubility of the component (A) in a developing solution containing an organic solvent does not change in an unexposed portion 30B of the photosensitive resin film 30, this results in a difference in the solubility of the component in a developing solution containing an organic solvent between the exposed portion 30A and the unexposed portion 30B of the photosensitive resin film 30. That is, the photosensitive resin film 30 is of negative tone. Therefore, in a case where the photosensitive resin film 30 is developed with a developing solution containing an organic solvent, the unexposed portion 30B is dissolved and removed to form a negative tone pattern.

Here, the negative tone photosensitive resin film 30 of the photosensitive resist film 30F is typically formed of a B-stage (semi-cured state) resin material.

As the photosensitive resist film 30F, a laminated film obtained by laminating the photosensitive resin film 30 on a base film is an exemplary example. It is preferable that a laminated film obtained by laminating the photosensitive resin film 30 on a base material is used as the photosensitive resist film 30F according to the present embodiment.

Such a photosensitive resist film 30F can be produced by coating the base film with a negative tone photosensitive composition, obtained by dissolving the component (A) and the component (I) in a solvent, and drying the composition to form the photosensitive resin film 30.

The base film may be coated with the negative tone photosensitive composition by an appropriate method of using an applicator, a blade coater, a lip coater, a comma coater, a film coater, or the like.

The thickness of the photosensitive resin film 30 is preferably in a range of 100 μm or less and more preferably in a range of 5 to 50 μm.

A known film can be used as the base film, and examples thereof include a thermoplastic resin film. Examples of the thermoplastic resin include polyester such as polyethylene terephthalate. The thickness of the base film is preferably in a range of 2 to 150 μm.

The following steps (i) to (v) are performed by using the substrate having the side wall on the surface thereof prepared in the first step and the photosensitive resist film prepared in the step (0).

[[Step (i)]]: S21

In the step (i), the photosensitive resist film 30F is disposed such that the surface of the photosensitive resin film 30 constituting the photosensitive resist film 30F blocks an opening surface of the recessed portion 15 formed by the side wall 20 and the substrate 10. Thereafter, the base film is peeled off from the photosensitive resin film 30 constituting the photosensitive resist film 30F.

In FIG. 2, the photosensitive resin film 30 constituting the photosensitive resist film 30F is disposed to face the substrate 10 via the side wall 20. A hollow closed space (cavity) surrounded by the substrate 10, the side wall 20, and the photosensitive resin film 30 is formed.

[[Step (ii)]]: S22

In the step (ii), the photosensitive resin film 30 is exposed.

For example, the photosensitive resin film 30 is selectively exposed via a photomask 60 on which a predetermined pattern has been formed, using a known exposure device.

The wavelength used for the exposure is not particularly limited, and radiation such as ultraviolet rays having a wavelength of 300 to 500 nm, i-rays (wavelength of 365 nm), or visible rays is used for selective irradiation (exposure). A low-pressure mercury lamp, a high-pressure mercury lamp, an ultra-high pressure mercury lamp, a metal halide lamp, an argon gas laser, or the like can be used as a source of the radiation described above.

[[Step (iii)]]: S23

In the step (iii), the exposed photosensitive resin film 30 is subjected to a heat treatment, that is, a so-called post-exposure baking (PEB) treatment.

The PEB treatment is performed, for example, under a temperature condition of 80° C. to 150° C. for 40 to 600 seconds and preferably 60 to 300 seconds.

By the heat treatment in step (iii), the exposed photosensitive resin film 30 is formed into the exposed portion 30A in which the epoxy group in the component (A) undergoes ring-opening polymerization and the unexposed portion 30B which remains unchanged.

[[Step (iv)]]: S24

In the step (iv), the photosensitive resin film 30 (the exposed portion 30A and the unexposed portion 30B) after the PEB treatment is developed to form a negative tone pattern (exposed portion 30A).

The development here can be performed in the same manner as in the section [developing step] described above. After the development, it is preferable to perform a rinse treatment.

The unexposed portion 30B is dissolved and removed by the development in the step (iv), and the exposed portion 30A serving as the top plate portion (the roof blocking the opening surface of the wall portion) has an afterimage as the negative tone pattern.

[[Step (v)]]: S25

In the step (v), the negative tone pattern (exposed portion 30A) after development is cured by performing a heat treatment (curing operation), and the hollow structure 100 in which the top plate portion consists of the cured body 40 of the photosensitive resin film 30 is obtained.

In FIG. 2, the cured body 40 is formed such that the photosensitive resin material forming the side wall 20 and the photosensitive resin film 30 are cured and integrated with each other.

Further, in FIG. 2, the hollow structure 100 according to this embodiment includes the substrate 10 having the aluminum wire and the cured body 40.

(Negative Tone Photosensitive Composition)

The negative tone photosensitive composition (hereinafter, also simply referred to as "photosensitive composition") used for the method for producing a hollow package according to the present embodiment contains a cationic polymerization initiator (I) consisting of a cationic moiety and an anionic moiety.

Specifically, the negative tone photosensitive composition used for the method for producing a hollow package according to the present embodiment contains a cationic polymerization initiator (I) and an epoxy group-containing compound (A) as a resin. Hereinafter, the component of the cationic polymerization initiator (I) is also referred to as "component (I)", and the epoxy group-containing compound (A) is also referred to as "component (A)".

In a case where the photosensitive resin film is formed by using such a photosensitive composition and selectively exposed, since the cationic moiety of the component (I) is decomposed so that an acid is generated, an epoxy group in the component (A) undergoes ring-opening polymerization due to an action of the acid, and thus the solubility of the component (A) in a developing solution containing an organic solvent decreases in the exposed portion of the photosensitive resin film while the solubility of the component (A) in a developing solution containing an organic solvent does not change in the unexposed portion of the photosensitive resin film, this results in a difference in the solubility of the component in a developing solution containing an organic solvent between the exposed portion and the unexposed portion of the photosensitive resin film. Therefore, in a case where the photosensitive resin film is developed with a developing solution containing an organic solvent, the unexposed portion is dissolved and removed to form a negative tone pattern.

<Cationic Polymerization Initiator (I)>

The cationic polymerization initiator (component (I)) is a compound which generates a cation upon irradiation with active energy rays, for example, excimer laser light such as ultraviolet rays, far ultraviolet rays, KrF, or ArF, X-rays, and electron beams and in which the cation can serve as a polymerization initiator.

In the negative tone photosensitive composition used for the method for producing a hollow package according to the present embodiment, the anionic moiety of the cationic polymerization initiator (I) contains an anion represented by General Formula (I1-an).

[Chemical Formula 2]

$$[(R\text{—})_k A\text{—}(X)_m]^{n-} \qquad \text{(I1-an)}$$

[In the formula, A represents a heteroatom selected from the group consisting of boron, aluminum, gallium, phosphorus, arsenic, antimony, and bismuth, X represents a halogen atom, R represents a monovalent organic group, k represents an integer of 1 to 6, where a plurality of R's may be linked to each other to form a divalent or higher valent organic group coordinated to A in a case where k represents 2 or greater, m represents an integer of 0 to 5, n represents an integer of 1 to 3, and m/(k+m) is 0 or greater and less than 0.7.]

In Formula (I1-an), A represents a heteroatom selected from the group consisting of boron, aluminum, gallium, phosphorus, arsenic, antimony, and bismuth. These heteroatoms are formed of Group 13 and 15 metals. Among these heteroatoms, boron, aluminum, gallium, phosphorus, or antimony is preferable, boron or phosphorus is more preferable, and boron is still more preferable as the heteroatom selected as A. One or two or more heteroatoms may be selected as the heteroatom.

In Formula (I1-an), R represents a monovalent organic group. In Formula (I1-an), a plurality of R's may be linked to each other to form a divalent or higher valent organic group coordinated to A in a case where k represents 2 or greater.

The term "organic group" denotes a group having a carbon atom, and the group may have atoms other than the carbon atom (for example, a hydrogen atom, an oxygen atom, a nitrogen atom, a sulfur atom, and a halogen atom (such as a fluorine atom or a chlorine atom)).

R represents preferably a monovalent hydrocarbon group having a halogen atom and particularly preferably a monovalent hydrocarbon group having a fluorine atom. The hydrocarbon group having a halogen atom may be linear, branched chain-like, or cyclic, and the number of carbon atoms thereof is preferably in a range of 1 to 15, more preferably in a range of 1 to 10, and particularly preferably in a range of 1 to 8.

R may represent a group having no halogen atom (such as a fluorine atom or a chlorine atom).

In a case where R represents a monovalent organic group, specific examples thereof include a fluorinated alkyl group, a fluorinated aryl group, a pentafluorophenyl group, a 3,5-ditrifluoromethylphenyl group, an alkoxylate, and nonafluoro-tert-butylalkoxylate ($(CF_3)_3C$—O—).

In a case where R represents a divalent organic group, specific examples thereof include catechol, a compound containing a 2,2-prime dihydroxyphenyl group, succinic acid, and oxalic acid.

In Formula (I1-an), m/(k+m) is 0 or greater and less than 0.7. The upper limit of m/(k+m) is preferably less than 0.6, more preferably 0.5 or less, and particularly preferably less than 0.5. The numerical value of m/(k+m) is an index for direct bonding of a halogen atom to a heteroatom. It is preferable that the numerical value of m/(k+m) decreases. Therefore, the numerical value of m/(k+m) is most preferably 0.

It is preferable that the component (I) in the photosensitive composition used for the method for producing a hollow package according to the present embodiment contains one or more selected from the group consisting of a compound represented by General Formula (I1) (hereinafter, referred to as "component (I1)") and a compound represented by General Formula (I2) (hereinafter, referred to as "component (I2)"). The component (I) in the photosensitive composition used for the method for producing a hollow package according to the present embodiment may further contain a compound represented by General Formula (I3-1) or (I3-2) (hereinafter, referred to as "component (I3)").

Among these, since both the component (I1) and the component (I2) generate a relatively strong acid upon exposure, the sensitivity is sufficiently obtained in a case where a pattern is formed using a photosensitive composition containing the component (I), and thus a satisfactory pattern is formed.

<<Component (I1)>>

The component (I1) is a compound represented by General Formula (I1).

[Chemical Formula 3]

(I1)

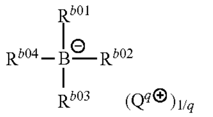

[In the formula, $R^{b01}$ to $R^{b04}$ each independently represent an aryl group which may have a substituent or a fluorine atom, where m/(k+m), which is a relational expression between the number (m) of fluorine atoms and the number (k) of aryl groups which may have a substituent, is 0 or greater and less than 0.7, q represents an integer of 1 or greater, and $Q^{q+}$'s each independently represent a q-valent organic cation.]

Anionic Moiety

In Formula (I1), $R^{b01}$ to $R^{b04}$ each independently represent an aryl group which may have a substituent or a fluorine atom.

The aryl group as $R^{b01}$ to $R^{b04}$ has preferably 5 to 30 carbon atoms, more preferably 5 to 20 carbon atoms, still more preferably 6 to 15 carbon atoms, and particularly preferably 6 to 12 carbon atoms. Specific examples thereof include a naphthyl group, a phenyl group, and an anthracenyl group, and a phenyl group is preferable from the viewpoint of availability.

The aryl group as $R^{b01}$ to $R^{b04}$ may have a substituent. The substituent is not particularly limited, but a halogen atom, a hydroxyl group, an alkyl group (preferably a linear or branched chain-like alkyl group, and the number of carbon atoms thereof is preferably in a range of 1 to 5), or a halogenated alkyl group is preferable, a halogen atom or a halogenated alkyl group having 1 to 5 carbon atoms is more preferable, and a fluorine atom or a fluorinated alkyl group having 1 to 5 carbon atoms is particularly preferable. It is preferable that the aryl group has a fluorine atom from the viewpoint that the polarity of the anionic moiety is increased.

Among the examples, $R^{b01}$ to $R^{b04}$ in Formula (I1) each independently represent preferably a fluorinated phenyl group and particularly preferably a perfluorophenyl group.

Specific preferred examples of the anionic moiety of the compound represented by Formula (I1) include tetrakis (pentafluorophenyl)borate ($[B(C_6F_5)_4]^-$), tetrakis [(trifluoromethyl)phenyl]borate ($[B(C_6H_4CF_3)_4]^-$), difluorobis(pentafluorophenyl)borate ($[(C_6F_5)_2BF_2]^-$), and tetrakis (difluorophenyl)borate ($[B(C_6H_3F_2)_4]^-$).

Among these, tetrakis(pentafluorophenyl)borate ($[B(C_6F_5)_4]^-$) is particularly preferable.

Among the anions, m/(k+m) which is the relational expression between the number (m) of fluorine atoms and the number (k) of fluorinated alkyl groups which may have a substituent is 0 in anions in which the number of fluorine atoms directly bonded to borane is "0" (($[B(C_6F_5)_4]^-$), ($[B(C_6H_4CF_3)_4]^-$), ($[B(C_6H_3F_2)_4]^-$), and ($[B(C_6F_5)_4]^-$)).

Among the anions, the relational expression of m/(k+m) is 0.5 in anions in which the number of fluorine atoms directly bonded to borane is "2" (($[(C_6F_5)_2BF_2]^-$)).

Further, in a case of a compound such as an anion in which the number of fluorine atoms directly bonded to borane is "3" (($[(C_6F_5)BF_3]^-$)), the relational expression of m/(k+m) is 0.75.

Cationic Moiety

In Formula (I1), q represents an integer of 1 or greater, and $Q^{q+}$'s each independently represent a q-valent organic cation.

$Q^{q+}$'s represent suitably a sulfonium cation or an iodonium cation and particularly preferably an organic cation represented by each of General Formulae (ca-1) to (ca-5).

[Chemical Formula 4]

(ca-1)

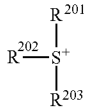

(ca-2)

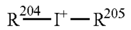

(ca-3)

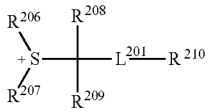

(ca-4)

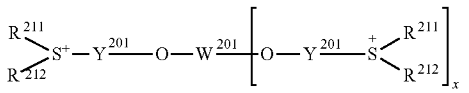

(ca-5)

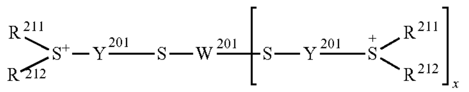

[In the formulae, $R^{201}$ to $R^{207}$, $R^{211}$, and $R^{212}$ each independently represent an aryl group, a heteroaryl group, an alkyl group, or an alkenyl group which may have a substituent, $R^{201}$ to $R^{203}$, $R^{206}$ and $R^{207}$, and $R^{111}$ and $R^{212}$ may be bonded to each other to form a ring with the sulfur atom in the formula, $R^{208}$ and $R^{209}$ each independently represent a hydrogen atom or an alkyl group having 1 to 5 carbon atoms, $R^{210}$ represents an aryl group which may have a substituent, an alkyl group which may have a substituent, an alkenyl group which may have a substituent, or a $—SO_2$-containing cyclic group which may have a substituent, $L^{201}$ represents —C(═O)— or —C(═O)—O—, $Y^{201}$'s each independently represent an arylene group, an alkylene group, or an alkenylene group, x represents 1 or 2, and $W^{201}$ represents an (x+1)-valent linking group.]

Examples of the aryl group as $R^{201}$ to $R^{207}$, $R^{211}$, and $R^{212}$ include an unsubstituted aryl group having 6 to 20 carbon atoms. Among these, a phenyl group or a naphthyl group is preferable.

Examples of the heteroaryl group as $R^{201}$ to $R^{207}$, $R^{211}$, and $R^{212}$ include those in which some carbon atoms constituting the aryl group are substituted with heteroatoms. Examples of the heteroatoms include an oxygen atom, a sulfur atom, and a nitrogen atom. Examples of the heteroaryl group include a group obtained by removing one hydrogen atom from 9H-thioxanthene, and examples of the substituted heteroaryl group include a group obtained by removing one hydrogen atom from 9H-thioxanthene-9-one. The alkyl group as $R^{201}$ to $R^{207}$, $R^{211}$, and $R^{212}$ is a chain-like or cyclic alkyl group, and the number of carbon atoms thereof is preferably in a range of 1 to 30.

It is preferable that the alkenyl group as $R^{201}$ to $R^{207}$, $R^{211}$, and $R^{212}$ has 2 to 10 carbon atoms.

Examples of the substituent that $R^{201}$ to $R^{207}$, $R^{210}$, and $R^{212}$ may have include an alkyl group, a halogen atom, a halogenated alkyl group, a carbonyl group, a cyano group, an amino group, an oxo group (=O), an aryl group, and a group represented by any of Formulae (ca-r-1) to (ca-r-10).

[Chemical Formula 5]

[ca-r-1]

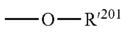

[ca-r-2]

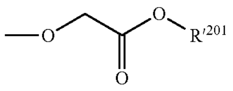

[ca-r-3]

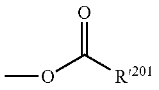

[ca-r-4]

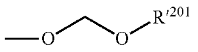

[ca-r-5]

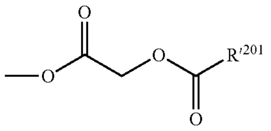

[ca-r-6]

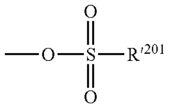

[ca-r-7]

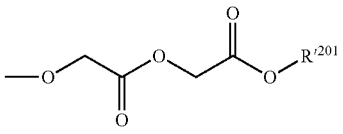

[ca-r-8]

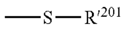

[ca-r-9]

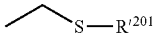

[ca-r-10]

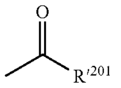

[In the formulae, each $R'^{201}$ independently represents a hydrogen atom, a cyclic group which may have a substituent, a chain-like alkyl group which may have a substituent, or a chain-like alkenyl group which may have a substituent.]

In Formulae (ca-r-1) to (ca-r-10), each $R'^{201}$ independently represents a hydrogen atom, a cyclic group which may have a substituent, a chain-like alkyl group which may have a substituent, or a chain-like alkenyl group which may have a substituent.

Cyclic group which may have substituent:

The cyclic group is preferably a cyclic hydrocarbon group, and the cyclic hydrocarbon group may be an aromatic hydrocarbon group or a cyclic aliphatic hydrocarbon group. The aliphatic hydrocarbon group indicates a hydrocarbon group that has no aromaticity. Further, the aliphatic hydrocarbon group may be saturated or unsaturated. In general, it is preferable that the aliphatic hydrocarbon group is saturated.

The aromatic hydrocarbon group as $R'^{201}$ is a hydrocarbon group having an aromatic ring. The aromatic hydrocarbon group has preferably 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring of the aromatic hydrocarbon group as $R'^{201}$ include benzene, fluorene, naphthalene, anthracene, phenanthrene, biphenyl, an aromatic heterocyclic ring in which some carbon atoms constituting these aromatic rings have been substituted with heteroatoms, and a ring in which some hydrogen atoms constituting these aromatic rings or aromatic heterocyclic rings have been substituted with oxo groups. Examples of the heteroatom in the aromatic heterocyclic rings include an oxygen atom, a sulfur atom, and a nitrogen atom.

Specific examples of the aromatic hydrocarbon group as $R'^{201}$ include a group obtained by removing one hydrogen atom from the aromatic ring (an aryl group such as a phenyl group, a naphthyl group, or an anthracenyl group), a group in which one hydrogen atom of the aromatic ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group), a group obtained by removing one hydrogen atom from a ring (such as anthraquinone) in which some hydrogen atoms constituting the aromatic ring have been substituted with an oxo group, and a group obtained by removing one hydrogen atom from an aromatic heterocyclic ring (such as 9H-thioxanthene or 9H-thioxanthene-9-one). The alkylene group (an alkyl chain in the arylalkyl group) has preferably 1 to 4 carbon atoms, more preferably 1 or 2 carbon atoms, and particularly preferably 1 carbon atom.

Examples of the cyclic aliphatic hydrocarbon group as $R'^{201}$ include an aliphatic hydrocarbon group having a ring in the structure thereof.

Examples of the aliphatic hydrocarbon group having a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched chain-like aliphatic hydrocarbon group, and a group in which the alicyclic hydrocarbon group is interposed in a linear or branched chain-like aliphatic hydrocarbon group.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among these, a polycycloalkane having a crosslinked ring polycyclic skeleton such as adamantane, norbornane, isobornane, tricyclodecane, or tetracyclododecane; and a polycycloalkane having a fused ring polycyclic skeleton such as a cyclic group having a steroid skeleton are preferable as the polycycloalkane.

Among these examples, as the cyclic aliphatic hydrocarbon group as $R'^{201}$, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The linear or branched chain-like aliphatic hydrocarbon group which may be bonded to the alicyclic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [$-CH_2-$], an ethylene group [$-(CH_2)_2-$], a trimethylene group [$-(CH_2)_3-$], a tetramethylene group [$-(CH_2)_4-$], and a pentamethylene group [$-(CH_2)_5-$].

As the branched chain-like aliphatic hydrocarbon group, a branched chain-like alkylene group is preferable, and specific examples thereof include alkylalkylene groups, for example, alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$, and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$, and $-C(CH_2CH_3)_2-CH_2-$; alkyltrimethylene groups such as $-CH(CH_3)CH_2CH_2-$ and $-CH_2CH(CH_3)CH_2-$; and alkyltetramethylene groups such as $-CH(CH_3)CH_2CH_2CH_2-$ and $-CH_2CH(CH_3)CH_2CH_2-$. As the alkyl group in the alkylalkylene group, a linear alkyl group having 1 to 5 carbon atoms is preferable.

Chain-like alkyl group which may have substituent:

The chain-like alkyl group as $R'^{201}$ may be linear or branched chain-like.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched chain-like alkyl group has preferably 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-like alkenyl group which may have substituent:

The chain-like alkenyl group as $R'^{201}$ may be linear or branched chain-like, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched chain-like alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

Examples of the substituent for the cyclic group, the chain-like alkyl group, or the chain-like alkenyl group as $R'^{201}$ include an alkoxy group, a halogen atom, a halogenated alkyl group, a hydroxyl group, a carbonyl group, a nitro group, an amino group, an oxo group, the cyclic group as $R'^{201}$, an alkylcarbonyl group, and a thienylcarbonyl group.

Among these, it is preferable that $R'^{201}$ represents a cyclic group which may have a substituent or a chin-like alkyl group which may have a substituent.

In a case where $R^{201}$ to $R^{203}$, $R^{206}$ and $R^{207}$, and $R^{211}$ and $R^{212}$ are bonded to each other to form a ring with a sulfur atom in the formula, these groups may be bonded to each other via a heteroatom such as a sulfur atom, an oxygen atom, or a nitrogen atom, or a functional group such as a carbonyl group, $-SO-$, $-SO_2-$, $-SO_3-$, $-COO-$, $-CONH-$ or $-N(R_N)-$ (here, $R_N$ represents an alkyl group having 1 to 5 carbon atoms). As a ring to be formed, one ring containing the sulfur atom in the formula in the ring skeleton thereof is preferably a 3- to 10-membered ring and particularly preferably a 5- to 7-membered ring including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

In Formula (ca-3), $R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represent an alkyl group, $R^{208}$ and $R^{209}$ may be bonded to each other to form a ring.

In Formula (ca-3), $R^{210}$ represents an aryl group which may have a substituent, an alkyl group which may have a substituent, an alkenyl group which may have a substituent, or a $-SO_2$-containing cyclic group which may have a substituent.

Examples of the aryl group as $R^{210}$ include an unsubstituted aryl group having 6 to 20 carbon atoms. Among these, a phenyl group or a naphthyl group is preferable.

As the alkyl group as $R^{210}$, a chain-like or cyclic alkyl group having 1 to 30 carbon atoms is preferable.

It is preferable that the alkenyl group as $R^{210}$ has 2 to 10 carbon atoms.

In Formulae (ca-4) and (ca-5), $Y^{201}$'s each independently represent an arylene group, an alkylene group, or an alkenylene group.

Examples of the arylene group as $Y^{201}$ include a group in which one hydrogen atom has been removed from an aryl group exemplified as the aromatic hydrocarbon group as $R'^{201}$.

Examples of the alkylene group and alkenylene group as $Y^{201}$ include a group in which one hydrogen atom has been removed from a group exemplified as the chain-like alkyl group or the chain-like alkenyl group as $R'^{201}$.

In Formulae (ca-4) and (ca-5), x represents 1 or 2.

$W^{201}$ represents a (x+1)-valent linking group, that is, a divalent or trivalent linking group.

As the divalent linking group as $W^{201}$, a divalent hydrocarbon group which may have a substituent is preferable, and the same groups as the divalent hydrocarbon groups which may have a substituent, exemplified in the section of $R^{EP}$ in Formula (abp1), are preferable. The divalent linking group as $W^{201}$ may be linear, branched chain-like, or cyclic and cyclic is more preferable. Among these, a group in which two carbonyl groups are combined at both ends of an arylene group, or a group consisting only of an arylene group is preferable. Examples of the arylene group include a phenylene group and a naphthylene group. Among these, a phenylene group is particularly preferable.

Examples of the trivalent linking group as $W^{201}$ include a group in which one hydrogen atom has been removed from a divalent linking group as $W^{201}$ and a group in which the divalent linking group has been further bonded to the divalent linking group. As the trivalent linking group as $W^{201}$, a group in which two carbonyl groups are bonded to an arylene group is preferable.

Specific examples of suitable cations represented by Formula (ca-1) include cations represented by Formulae (ca-1-1) and (ca-1-24).

[Chemical Formula 6]

(ca-1-1)

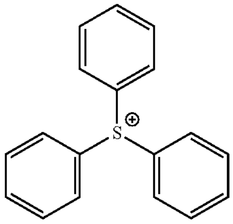

(ca-1-2)

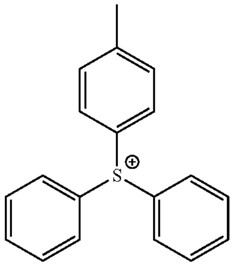

(ca-1-3)

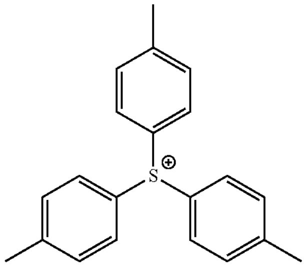

(ca-1-4)

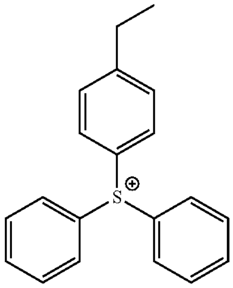

-continued (ca-1-5)

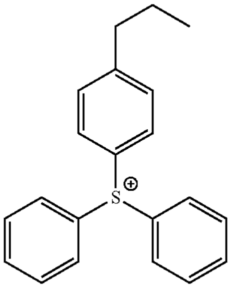

(ca-1-6)

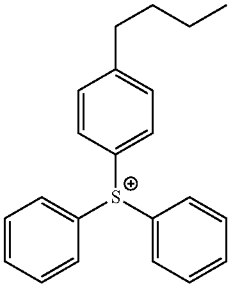

(ca-1-7)

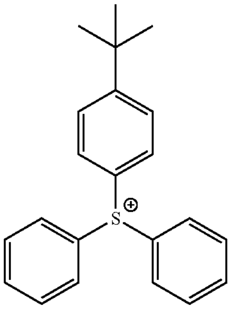

(ca-1-8)

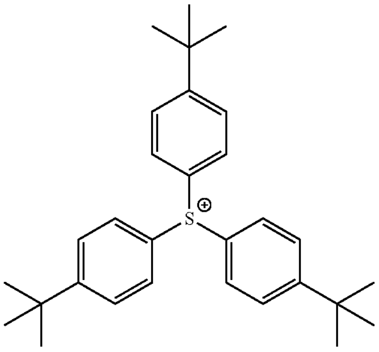

(ca-1-9)

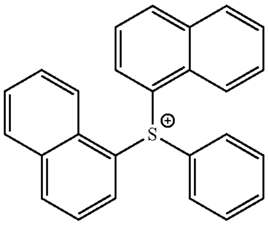

-continued
(ca-1-10)
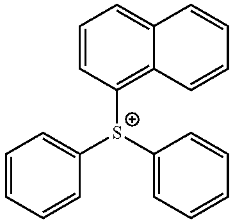
[Chemical Formula 7]
(ca-1-11)
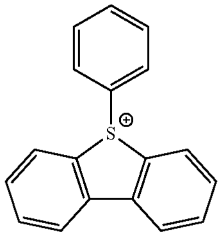
(ca-1-12)
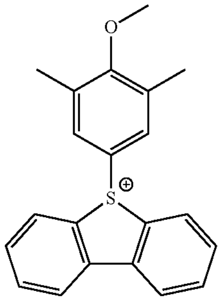
(ca-1-13)
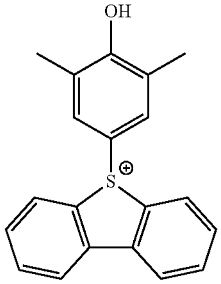
(ca-1-14)
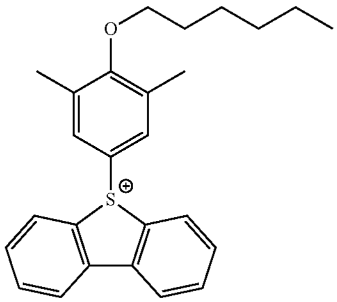
-continued
(ca-1-15)
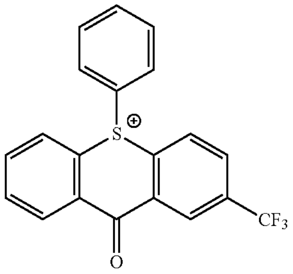
(ca-1-16)
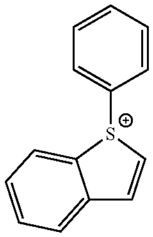
(ca-1-17)
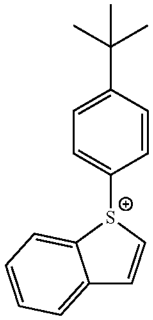
(ca-1-18)
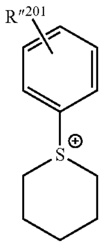
(ca-1-19)
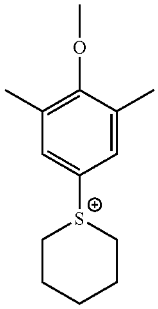

-continued
(ca-1-20)
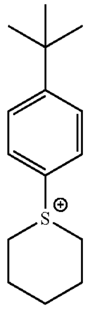
(ca-1-21)
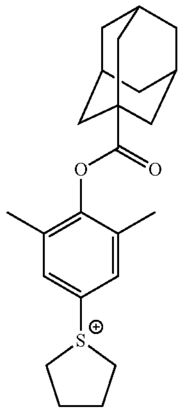
(ca-1-22)
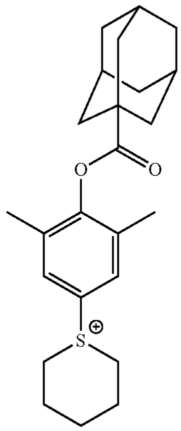
(ca-1-23)
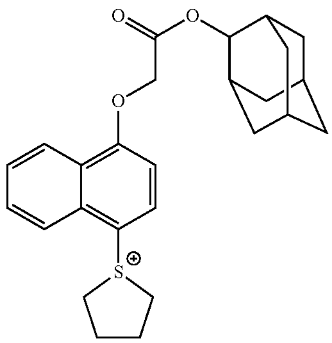
-continued
(ca-1-24)
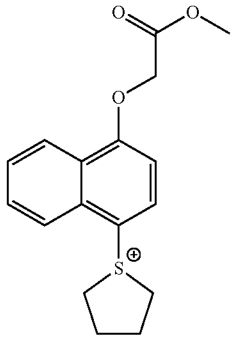
[In the formula, R"[201] represents a hydrogen atom or a substituent, and examples of the substituent are the same as the substituents that $R^{201}$ to $R^{207}$ and $R^{210}$ to $R^{212}$ may have.]
Further, as the cation represented by Formula (ca-1), cations represented by General Formulae (ca-1-25) to (ca-1-35) are also preferable.
[Chemical Formula 8]
(ca-1-25)
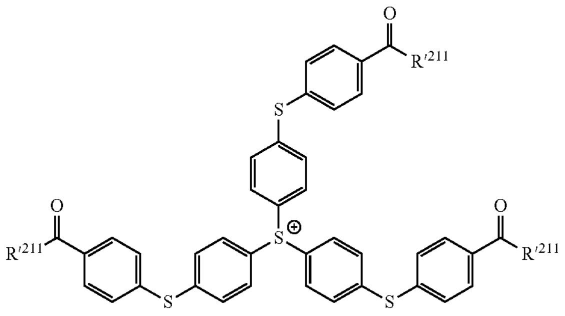
(ca-1-26)
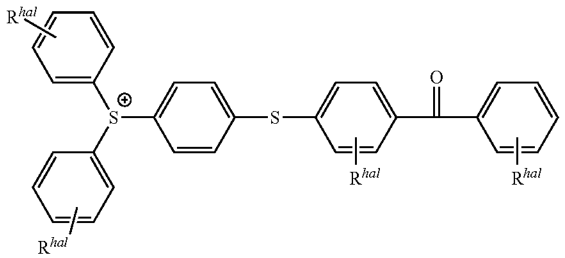
(ca-1-27)
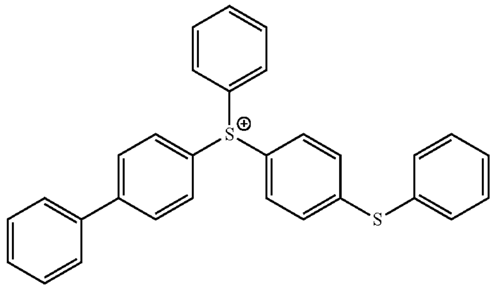

-continued
(ca-1-28)
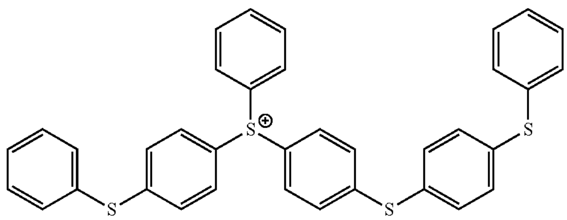
(ca-1-29)
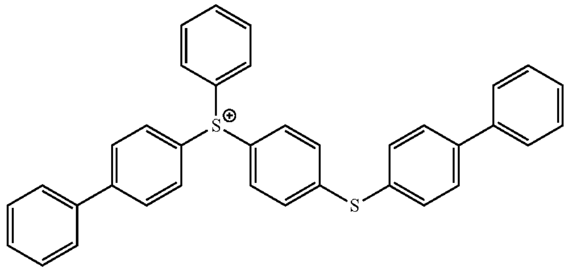
[Chemical Formula 9]
(ca-1-30)
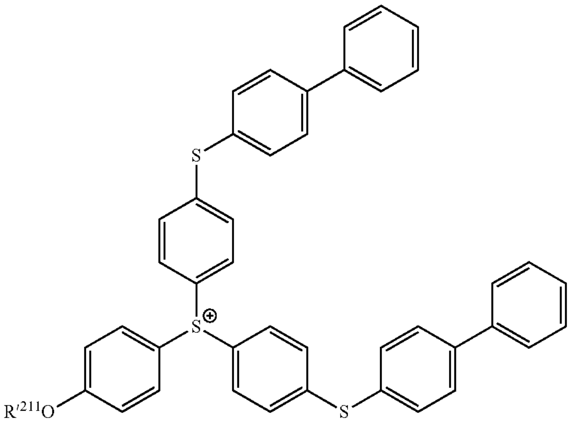
(ca-1-31)
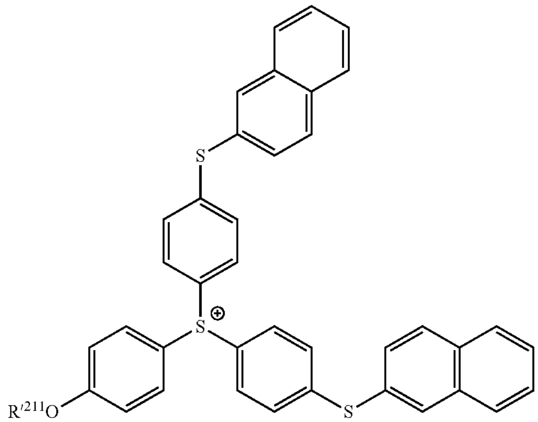
-continued
(ca-1-32)
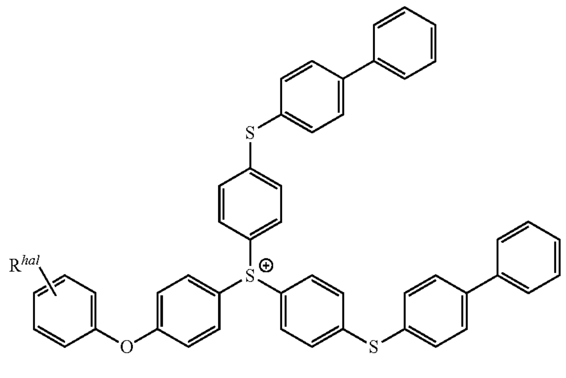
(ca-1-33)
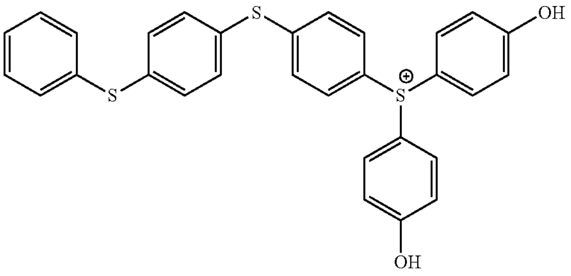
(ca-1-34)
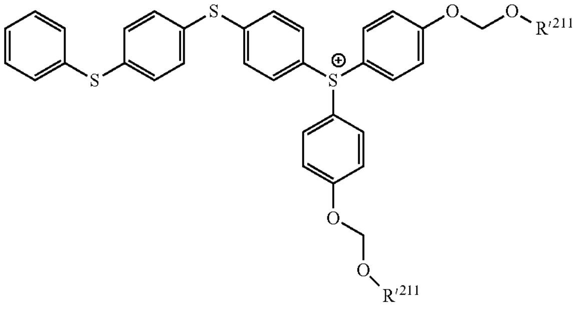
(ca-1-35)
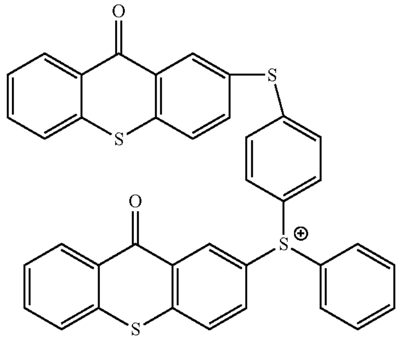
[In the formula, $R'^{211}$ represents an alkyl group, and $R^{hal}$ represents a hydrogen atom or a halogen atom.]
Further, as the cation represented by Formula (ca-1), cations represented by Chemical Formulae (ca-1-36) to (ca-1-48) are also preferable.

[Chemical Formula 10]
(ca-1-36)
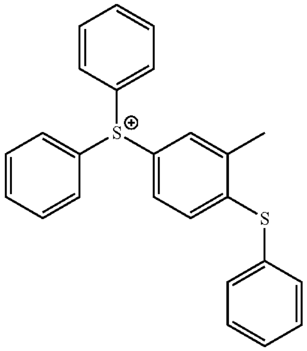
(ca-1-37)
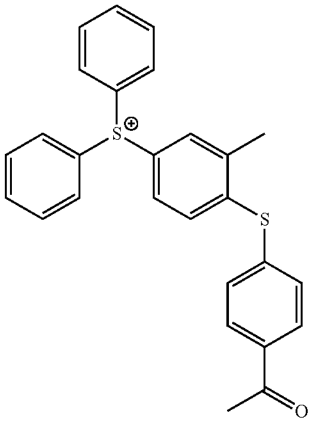
(ca-1-38)
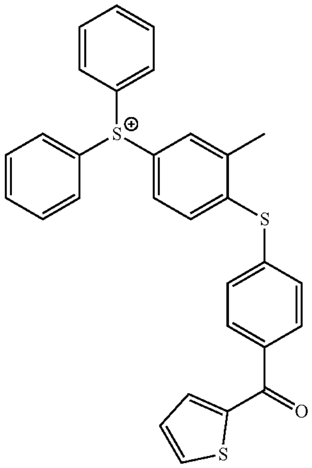
-continued
(ca-1-39)
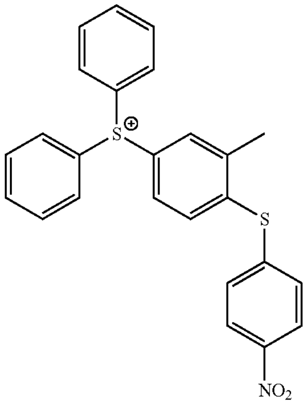
(ca-1-40)
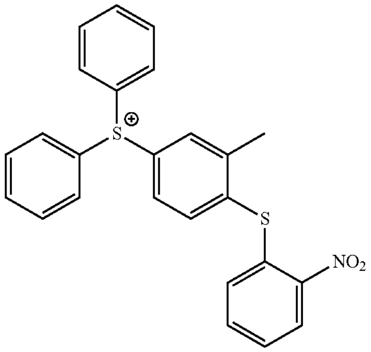
(ca-1-41)
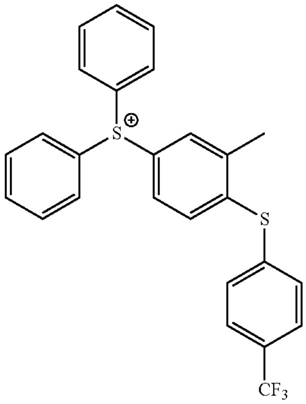
(ca-1-42)
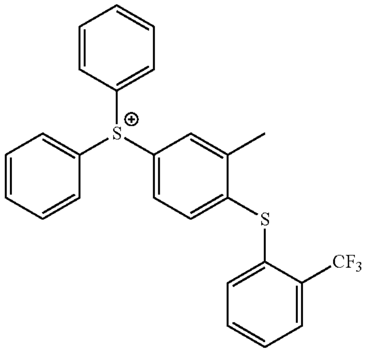

-continued
(ca-1-43)
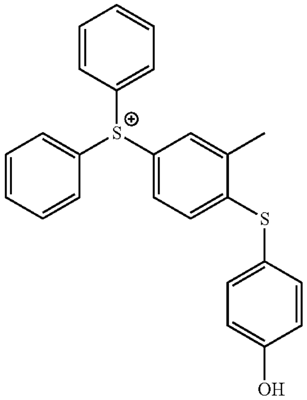
(ca-1-44)
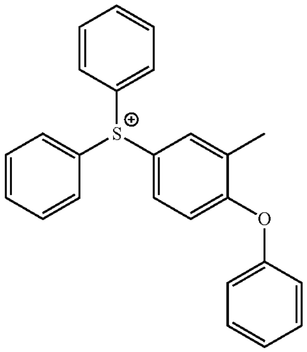
(ca-1-45)
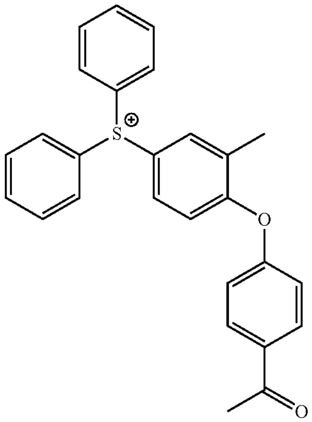
(ca-1-46)
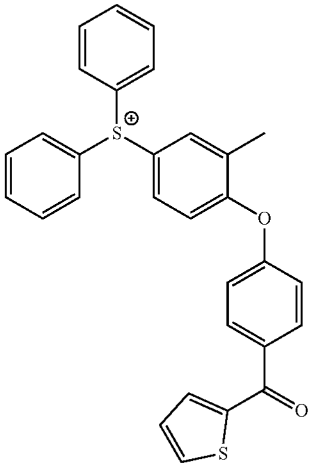
-continued
(ca-1-47)
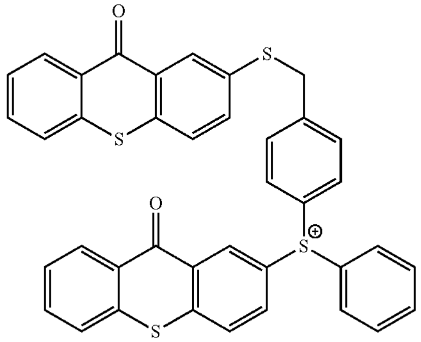
(ca-1-48)
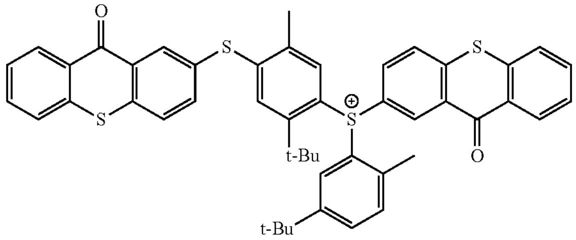
Specific examples of suitable cations represented by Formula (ca-2) include a diphenyliodonium cation and a bis(4-tert-butylphenyl)iodonium cation.
Specific examples of suitable cations represented by Formula (ca-3) include cations represented by Formulae (ca-3-1) to (ca-3-6).
[Chemical Formula 11]
(ca-3-1)
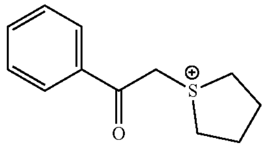
(ca-3-2)
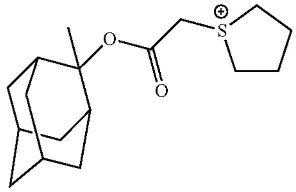
(ca-3-3)
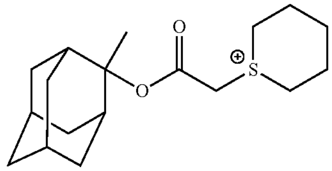
(ca-3-4)
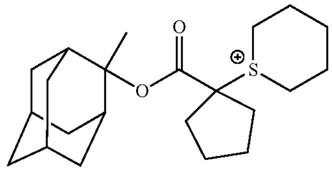

-continued
(ca-3-5)
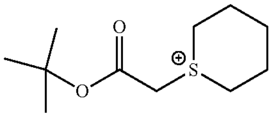
(ca-3-6)
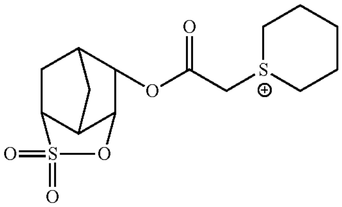
Specific examples of suitable cations represented by Formula (ca-4) include cations represented by Formulae (ca-4-1) and (ca-4-2).
[Chemical Formula 12]
(ca-4-1)
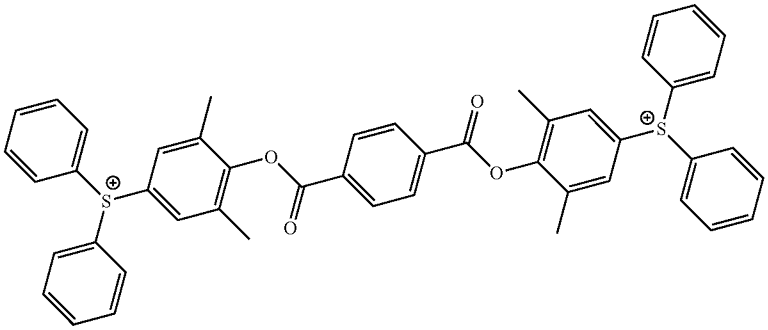
(ca-4-2)
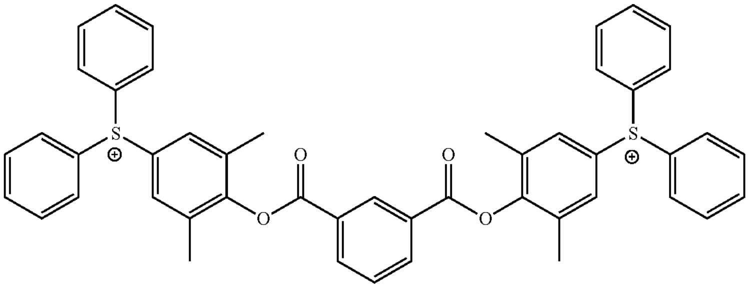

Further, as the cation represented by Formula (ca-5), cations represented by General Formulae (ca-5-1) to (ca-5-3) are also preferable.
[Chemical Formula 13]
(ca-5-1)
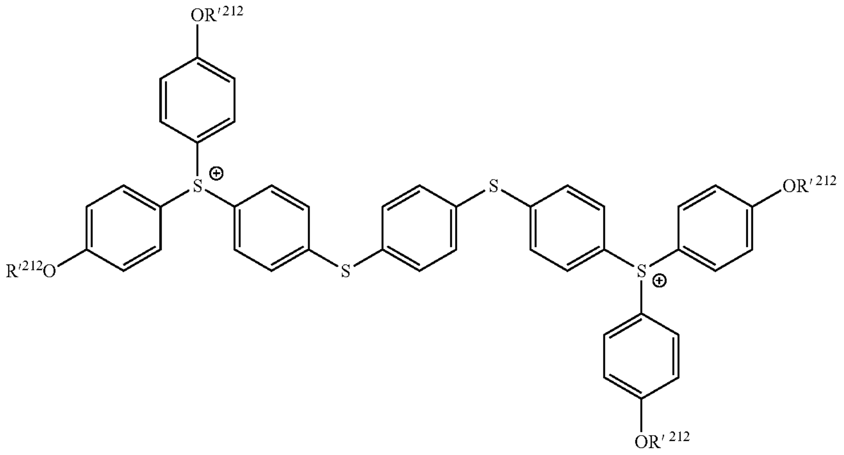
(ca-5-2)
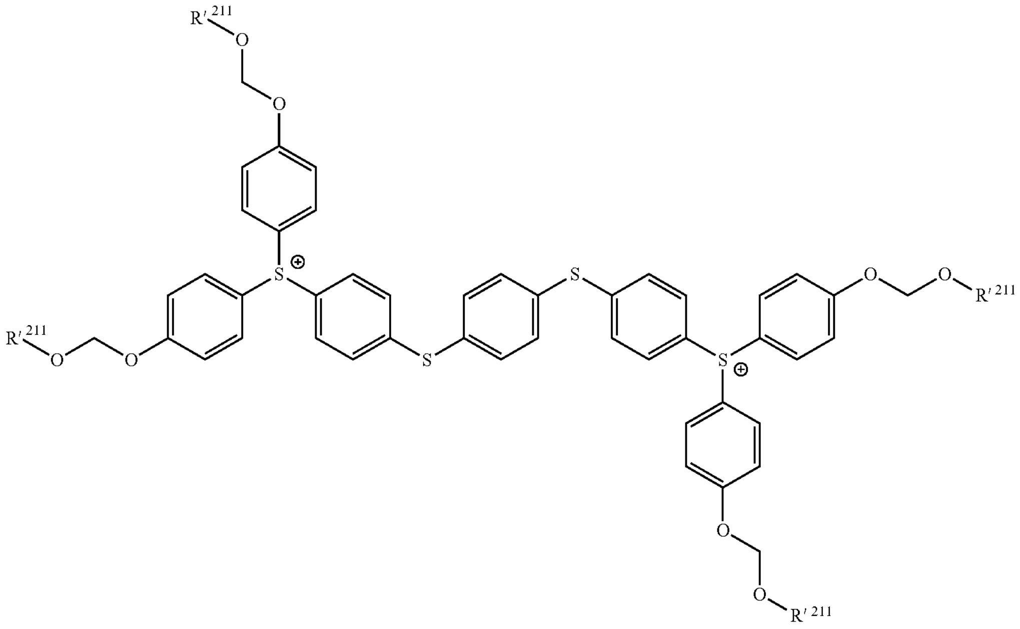
(ca-5-3)
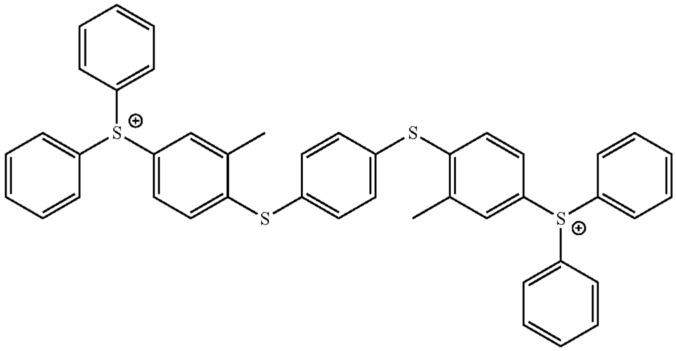

[In the formula, R'[212] represents an alkyl group or a hydrogen atom, and R'[211] represents an alkyl group.]

Among the examples, as a cationic moiety $[(Q^{q+})_{1/q}]$, a cation represented by General Formula (ca-1) is preferable, cations represented by Formulae (ca-1-1) to (ca-1-48) are more preferable, cations represented by Formulae (ca-1-25), (ca-1-35), and (ca-1-48) are still more preferable, and cations represented by Formulae (ca-1-25) and (ca-1-48) are particularly preferable.

Specific suitable examples of the component (I1) are shown below.

In the anions of the compounds shown in the specific examples, m/(k+m), which is a relational expression between the number (m) of fluorine atoms and the number (k) of aryl groups which may have a substituent, is 0 in all cases.

[Chemical Formula 14]

(I1-1)

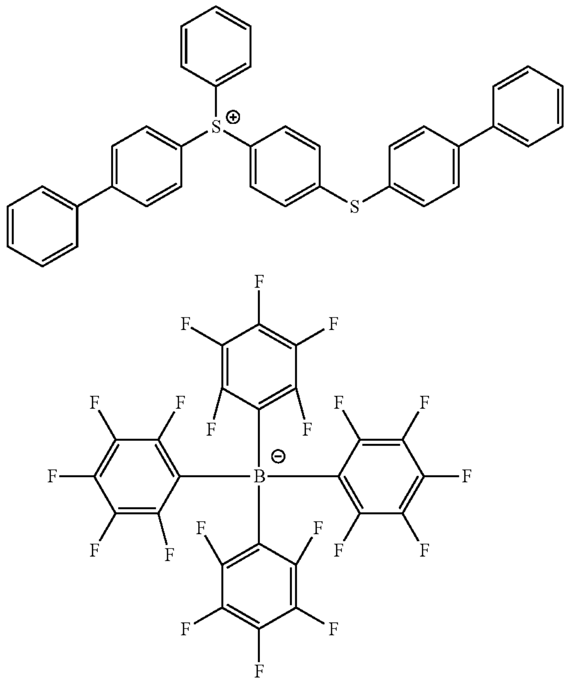

(I1-2)

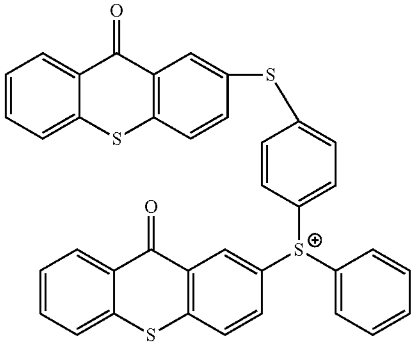

-continued

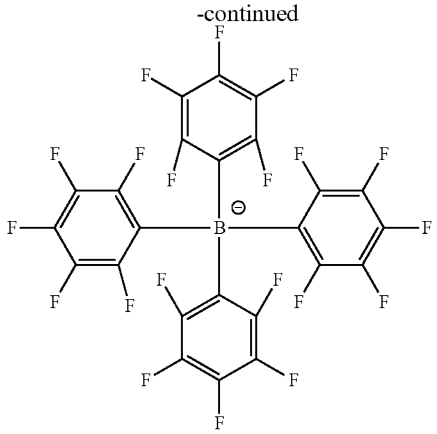

(I1-3)

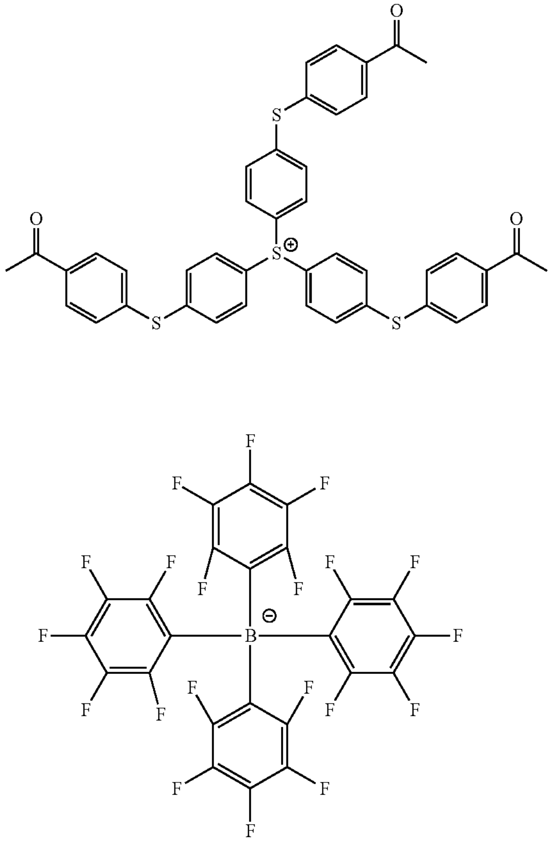

(I1-4)

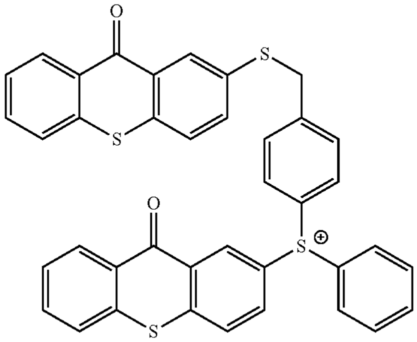

-continued

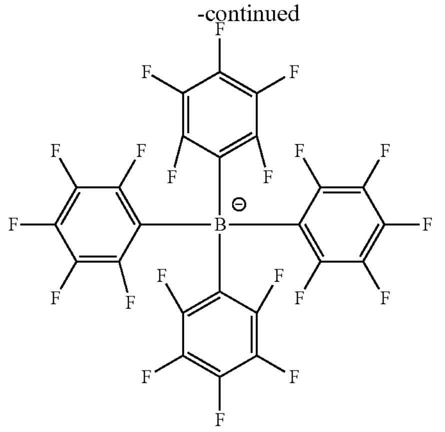

<<(I2) Component>>

The component (12) is a compound represented by General Formula (I2).

[Chemical Formula 15]

$$P^{\ominus}\left(R^{b05}\right)_6 \quad \left(Q^{q\oplus}\right)_{1/q} \qquad (I2)$$

[In the formula, $R^{b05}$ represents a fluorinated alkyl group which may have a substituent or a fluorine atom, a plurality of $R^{b05}$ 's may be the same as or different from each other, where m/(k+m), which is a relational expression between the number (m) of fluorine atoms and the number (k) of fluorinated alkyl groups which may have a substituent, is 0 or greater and less than 0.7, q represents an integer of 1 or greater, and $Q^{q+}$'s each independently represent a q-valent organic cation.]

Anionic Moiety

In Formula (I2), $R^{b05}$ represents a fluorinated alkyl group which may have a substituent or a fluorine atom. A plurality of $R^{b05}$'s may be the same as or different from each other.

The fluorinated alkyl group as $R^{b05}$ has preferably 1 to 10 carbon atoms, more preferably 1 to 8 carbon atoms, and still more preferably 1 to 5 carbon atoms. Specific examples thereof include an alkyl group having 1 to 5 carbon atoms, in which some or all hydrogen atoms have been substituted with fluorine atoms.

Among the examples, $R^{b05}$ represents preferably a fluorine atom or a fluorinated alkyl group having 1 to 5 carbon atoms, more preferably a fluorine atom or a perfluoroalkyl group having 1 to 5 carbon atoms, and still more preferably a fluorine atom, a trifluoromethyl group, or a pentafluoroethyl group.

As the anionic moiety of the compound represented by Formula (I2), an anion represented by General Formula (b0-2a) is preferable.

[Chemical Formula 16]

$$\left[\left(R^{bf05}\right)_{nb^1}PF_{(6-nb^1)}\right]^{\ominus} \qquad (b0\text{-}2a)$$

[In the formula, $R^{bf05}$ represents a fluorinated alkyl group which may have a substituent, and $nb^1$ represents an integer of 2 to 6.]

In Formula (b0-2a), examples of the fluorinated alkyl group which may have a substituent as $R^{bf05}$ are the same as those for the fluorinated alkyl group which may have a substituent as $R^{b05}$.

Among these, $R^{bf05}$ represents preferably a fluorinated alkyl group having 1 to 5 carbon atoms, more preferably a perfluoroalkyl group having 1 to 5 carbon atoms, and still more preferably a trifluoromethyl group or a pentafluoroethyl group.

In Formula (b0-2a), $nb^1$ represents preferably an integer of 2 to 4 and most preferably 3.

Specific preferred examples of the anionic moiety of the compound represented by Formula (I2) include anions represented by $(CF_3CF_2)_2PF_4^-$, $(CF_3CF_2)_3PF_3^-$, $((CF_3)_2CF)_2PF_4^-$, $((CF_3)_2CF)_3PF_3^-$, $(CF_3CF_2CF_2)_2PF_4^-$, $(CF_3CF_2CF_2)_3PF_3^-$, $((CF_3)_2CFCF_2)_2PF_4^-$, $((CF_3)_2CFCF_2)_3PF_3^-$, $(CF_3CF_2CF_2CF_2)_2PF_4^-$, and $(CF_3CF_2CF_2CF_2)_3PF_3^-$.

Among these, $((CF_3)_2CF)_3PF_3^-$ is preferable.

Among the above-described anions, in an anion in which $nb^1$ in General Formula (b0-2a) represents "2", m/(k+m) which is the relational expression between the number (m) of fluorine atoms and the number (k) of fluorinated alkyl groups which may have a substituent is 0.667.

Among the above-described anions, in an anion in which $nb^1$ in General Formula (b0-2a) represents "3", m/(k+m) is 0.5.

Cationic Moiety

In Formula (I2), q represents an integer of 1 or greater, and $Q^{q+}$'s each independently represent a q-valent organic cation.

$Q^{q+}$ has the same definition as that for $Q^{q+}$ in Formula (I1). Among the examples, a cation represented by General Formula (ca-1) is preferable, a cation represented by any of Formulae (ca-1-1) to (ca-1-47) is more preferable, and a cation represented by any of Formulae (ca-1-35) and (ca-1-47) is still more preferable.

Specific suitable examples of the component (I2) are shown below.

In the anions of the compounds shown in the specific examples, m/(k+m) which is the relational expression between the number (m) of fluorine atoms and the number (k) of fluorinated alkyl groups which may have a substituent is 0.5.

[Chemical Formula 17]

(I2-1)

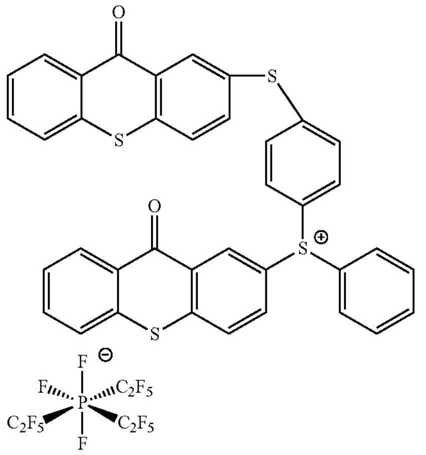

The content of the component (I) is preferably in a range of 0.5 to 5 parts by mass, more preferably in a range of 0.8 to 4.5 parts by mass, and particularly preferably in a range of 1 to 4 parts by mass with respect to 100 parts by mass of the component (A).

In a case where the content of the component (I) is greater than or equal to the lower limits of the above-described preferable ranges, corrosion of the aluminum wire constituting the hollow package can be sufficiently suppressed. Further, the sensitivity is sufficiently obtained, and the lithography characteristics of the pattern are further improved. In addition, the hardness of the cured film is further enhanced. Meanwhile, in a case where the content thereof is less than or equal to the upper limits of the above-described preferable ranges, the sensitivity is moderately controlled, and a pattern having a satisfactory shape is likely to be obtained.

<<Component (I3)>>

The component (I3) is a compound represented by General Formula (I3-1) or (I3-2).

[Chemical Formula 18]

(I3-1)

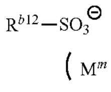

(I3-2)

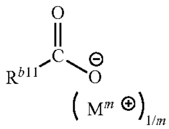

[In the formulae, $R^{b11}$ and $R^{b12}$ represent a cyclic group which may have a substituent other than a halogen atom, a chain-like alkyl group which may have a substituent other than a halogen atom, or a chain-like alkenyl group which may have a substituent other than a halogen atom, m represents an integer of 1 or greater, and each $M^{m+}$ independently represents an m-valent organic cation.]

{Component (I3-1)}

Anionic Moiety

In Formula (I3-1), $R^{b12}$ represents a cyclic group which may have a substituent other than a halogen atom, a chain-like alkyl group which may have a substituent other than a halogen atom, or a chain-like alkenyl group which may have a substituent other than a halogen atom, and examples thereof include groups having no substituent or having a substituent other than a halogen atom among the cyclic group, the chain-like alkyl group, and the chain-like alkenyl group as $R'^{201}$ described above.

It is preferable that $R^{b12}$ represents a chain-like alkyl group which may have a substituent other than a halogen atom or an aliphatic cyclic group which may have a substituent other than a halogen atom. The chain-like alkyl group has preferably 1 to 10 carbon atoms and more preferably 3 to 10 carbon atoms. As the aliphatic cyclic group, a group in which one or more hydrogen atoms have been removed from adamantane, norbornane, isobornane, tricyclodecane, or tetracyclododecane (a group which may have a substituent other than a halogen atom); and a group in which one or more hydrogen atoms have been removed from camphor are more preferable.

The hydrocarbon group as $R^{b12}$ may have a substituent other than a halogen atom, and examples of the substituent include the substituents other than a halogen atom that the hydrocarbon group (an aromatic hydrocarbon group, an aliphatic cyclic group, or a chain-like alkyl group) as $R^{b11}$ in Formula (I3-2) may have.

Here, the expression of "may have a substituent other than a halogen atom" excludes not only a case of having a substituent consisting only of a halogen atom, but also a case of having a substituent having even one halogen atom (for example, a case where the substituent is a fluorinated alkyl group).

Specific preferred examples of the anionic moiety in the component (I3-1) are shown below.

[Chemical Formula 19]

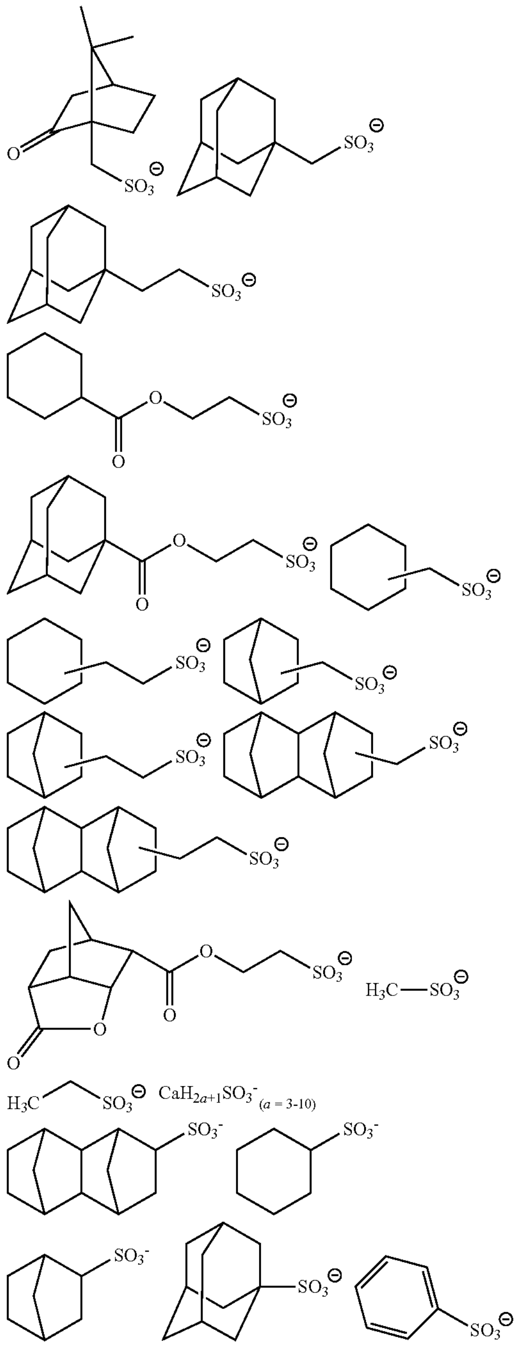

$C_aH_{2a+1}SO_3^-$ (a = 3-10)

-continued

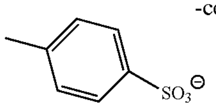

Cationic Moiety

In Formula (I3-1), $M^{m+}$ represents an m-valent organic cation.

Suitable examples of the organic cation as $M^{m+}$ include the cations represented by General Formulae (ca-1) to (ca-5). Among these, the cation represented by General Formula (ca-1) is more preferable. Among these, a sulfonium cation in which at least one of $R^{201}$, $R^{202}$, or $R^{203}$ in General Formula (ca-1) represents an organic group (such as an aryl group, a heteroaryl group, an alkyl group, or an alkenyl group) having 16 or more carbon atoms which may have a substituent is particularly preferable from the viewpoint of improving the resolution and roughness characteristics. The substituent that the organic group may have is as described above, and examples thereof include an alkyl group, a halogen atom, a halogenated alkyl group, a carbonyl group, a cyano group, an amino group, an oxo group (=O), an aryl group, and groups represented by Formulae (ca-r-1) to (ca-r-10).

The number of carbon atoms in the organic group (such as an aryl group, a heteroaryl group, an alkyl group, or an alkenyl group) is preferably in a range of 16 to 25, more preferably in a range of 16 to 20, and particularly preferably in a range of 16 to 18, and suitable examples of such an organic cation as $M^{m+}$ include cations represented by Formulae (ca-1-25), (ca-1-26), (ca-1-28) to (ca-1-36), (ca-1-38), (ca-1-46), and (ca-1-47). Among these, a cation represented by Formula (ca-1-29) is particularly preferable.

{Component (I3-2)}

Anionic Moiety

In Formula (I3-2), $R^{b11}$ represents a cyclic group which may have a substituent other than a halogen atom, a chain-like alkyl group which may have a substituent other than a halogen atom, or a chain-like alkenyl group which may have a substituent other than a halogen atom, and examples thereof include groups having no substituent or having a substituent other than a halogen atom among the cyclic group, the chain-like alkyl group, and the chain-like alkenyl group as $R'^{201}$ described above.

Among these, It is preferable that $R^{b11}$ represents an aromatic hydrocarbon group which may have a substituent other than a halogen atom, an aliphatic cyclic group which may have a substituent other than a halogen atom, or a chain-like alkyl group which may have a substituent other than a halogen atom. Examples of the substituents that these groups may have include a hydroxyl group, an oxo group, an alkyl group, an aryl group, a lactone-containing cyclic group, an ether bond, an ester bond, and a combination thereof.

In a case where the above-described groups have an ether bond or an ester bond as the substituent, the groups may have an ether bond or an ester bond via an alkylene group, and a linking group represented by any of General Formulae (y-al-1) to (y-al-7) is preferable as the substituent in this case.

[Chemical Formula 20]

(y-al-1)

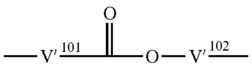

(y-al-2)

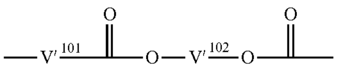

(y-al-3)

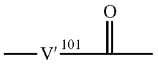

(y-al-4)

$—V'^{101}—O—$ (y-al-5)

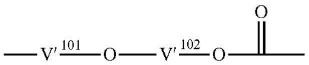

(y-al-6)

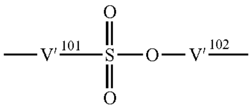

(y-al-7)

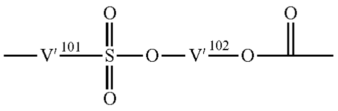

[In the formulae, $V'^{101}$ represents a single bond or an alkylene group having 1 to 5 carbon atoms, and $V'^{102}$ represents a divalent saturated hydrocarbon group having 1 to carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched chain-like alkylene group, and a linear alkylene group is preferable.

Specific examples of the alkylene group as $V'^{101}$ and $V'^{102}$ include a methylene group [$—CH_2—$]; an alkylmethylene group such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, or $—C(CH_2CH_3)_2—$; an ethylene group [$—CH_2CH_2—$]; an alkylethylene group such as $—CH(CH_3)CH_2—$, $—CH(CH_3)CH(CH_3)—$, $—C(CH_3)_2CH_2—$, or $—CH(CH_2CH_3)CH_2—$; a trimethylene group (n-propylene group) [$—CH_2CH_2CH_2—$]; an alkyltrimethylene group such as $—CH(CH_3)CH_2CH_2—$ or $—CH_2CH(CH_3)CH_2—$; a tetramethylene group [$—CH_2CH_2CH_2CH_2—$]; an alkyltetramethylene group such as $—CH(CH_3)CH_2CH_2CH_2—$ or $—CH_2CH(CH_3)CH_2CH_2—$; and a pentamethylene group [$—CH_2CH_2CH_2CH_2CH_2—$].

Further, a part of methylene group in the alkylene group as $V'^{101}$ and $V'^{102}$ may be substituted with a divalent aliphatic cyclic group having 5 to 10 carbon atoms. As the aliphatic cyclic group, a divalent group in which one hydrogen atom has been removed from the cyclic aliphatic hydrocarbon group (a monocyclic alicyclic hydrocarbon group or a polycyclic alicyclic hydrocarbon group) as $R'^{201}$ is preferable, and a cyclohexylene group, a 1,5-adamantylene group, or a 2,6-adamantylene group is more preferable.

A phenyl group or a naphthyl group is more preferable as the aromatic hydrocarbon group.

As the aliphatic cyclic group, a group in which one or more hydrogen atoms have been removed from a polycycloalkane such as adamantane, norbornane, isobornane, tricyclodecane or tetracyclododecane is more preferable.

It is preferable that the chain-like alkyl group has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group; and a branched chain-like alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

It is preferable that $R^{b11}$ represents a cyclic group which may have a substituent other than a halogen atom.

Specific preferred examples of the anionic moiety in the component (I3-2) are shown below.

[Chemical Formula 21]

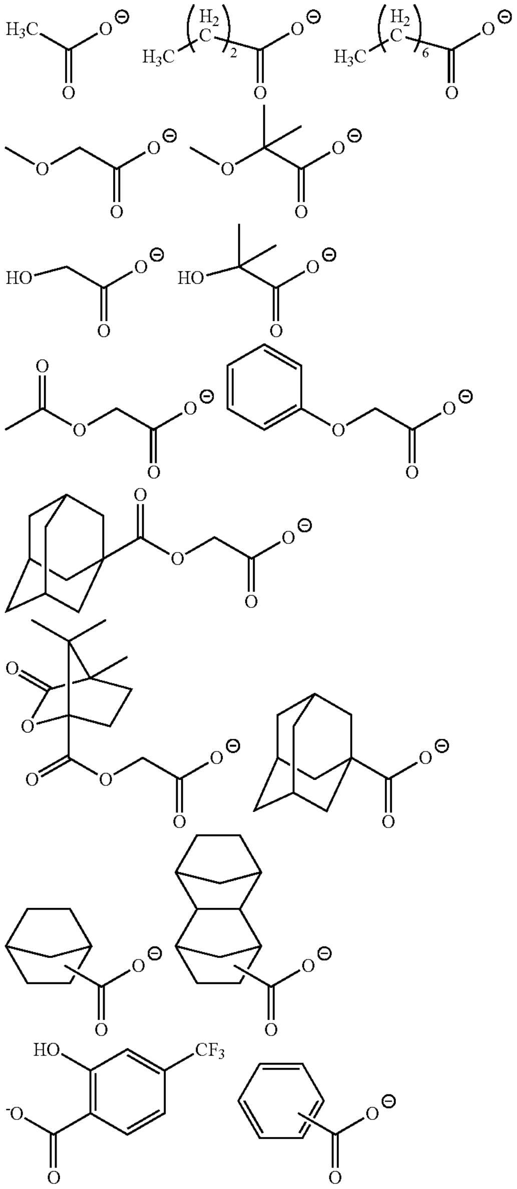

-continued

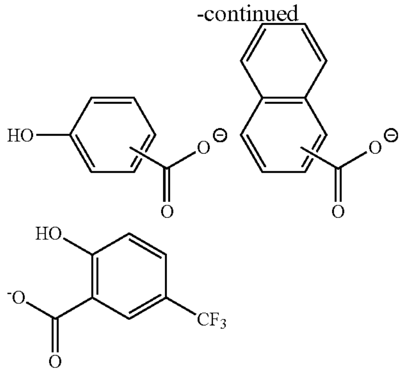

Cationic Moiety

In Formula (I3-2), $M^{m+}$ represents an m-valent organic cation and has the same definition as that for $M^{m+}$ in Formula (I3-1).

Specific suitable examples of the component (I3) are shown below.

[Chemical Formula 22]

(I3-1-1)

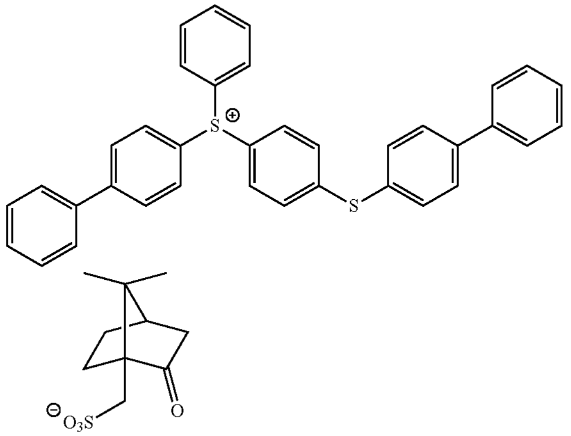

The component (P) may be used alone or in combination of two or more kinds thereof. Specifically, the component (I) includes one or more selected from the group consisting of the component (I1) and the component (I2), and may further include the component (I3).

Further, from the viewpoint that the elasticity of the resin film is increased and a fine structure is easily formed without residues, it is preferable that the component (I) is a cationic polymerization initiator that generates an acid with a pKa (acid dissociation constant) of −5 or less upon exposure. By using a cationic polymerization initiator that generates an acid having a pKa of more preferably −6 or less and still more preferably −8 or less, high sensitivity to exposure can be obtained. The lower limit of the pKa of the acid generated by the component (I) is preferably −15 or greater. High sensitivity is likely to be achieved by using a cationic polymerization initiator that generates such an acid having a suitable pKa.

Here, the term “pKa (acid dissociation constant)” is an index that has been typically used to show the acid strength of a target substance. Further, the pKa in the present specification is a value under a temperature condition of 25° C.

Further, the pKa value can be acquired by performing measurement using a known method. In addition, calculated values using known software such as "ACD/Labs" (trade name, manufactured by Advanced Chemistry Development, Inc.) can also be used.

<Epoxy Group-Containing Compound (A)>

The epoxy group-containing compound (component (A)) used in the photosensitive composition of the present embodiment may include a compound represented by General Formula (A1) (hereinafter, referred to as "component (A1)") and a compound represented by General Formula (A2) (hereinafter, referred to as "component (A2)").

<<Component (A1)>>

Examples of the component (A1) include an epoxy resin having a structure represented by General Formula (abp1).

[Chemical Formula 23]

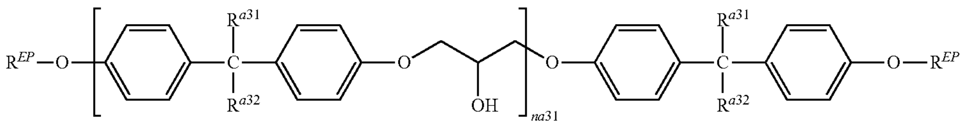

(abp1)

[In the formula, $R^{EP}$ represents an epoxy group-containing group, $R^{a31}$ and $R^{a32}$ each independently represent a hydrogen atom or an alkyl group having 1 to 5 carbon atoms, and $na^{31}$ represents an integer of 1 to 50.]

In Formula (abp1), $R^{EP}$ represents an epoxy group-containing group.

The epoxy group-containing group as $R^{EP}$ is not particularly limited, and examples thereof include a group consisting only of an epoxy group, a group consisting only of an alicyclic epoxy group, and a group containing an epoxy group or an alicyclic epoxy group and a divalent linking group.

The alicyclic epoxy group is an alicyclic group having an oxacyclopropane structure which is 3-membered ring ether, and specifically, the alicyclic epoxy group is a group having an alicyclic group and an oxacyclopropane structure.

The alicyclic group that forms a basic skeleton of an alicyclic epoxy group may be monocyclic or polycyclic. Examples of the monocyclic alicyclic group include a cyclopropyl group, a cyclobutyl group, a cyclopentyl group, a cyclohexyl group, a cycloheptyl group, and a cyclooctyl group. Further, examples of the polycyclic alicyclic group include a norbornyl group, an isobornyl group, a tricyclononyl group, a tricyclodecyl group, and a tetracyclododecyl group. Further, the hydrogen atoms of these alicyclic groups may be substituted with an alkyl group, an alkoxy group, a hydroxyl group, or the like.

In a case of the group containing an epoxy group or an alicyclic epoxy group and a divalent linking group, it is preferable that the epoxy group or the alicyclic epoxy group is bonded via the divalent linking group bonded to an oxygen atom (—O—) in the formula.

Here, the divalent linking group is not particularly limited, and suitable examples thereof include a divalent hydrocarbon group which may have a substituent and a divalent linking group having a heteroatom.

In regard to divalent hydrocarbon group which may have substituent:

Such a divalent hydrocarbon group may be an aliphatic hydrocarbon group or an aromatic hydrocarbon group.

The aliphatic hydrocarbon group in the divalent hydrocarbon group may be saturated or unsaturated. In general, it is preferable that the aliphatic hydrocarbon group is saturated.

More specific examples of the aliphatic hydrocarbon group include a linear or branched chain-like aliphatic hydrocarbon group and an aliphatic hydrocarbon group having a ring in the structure thereof.

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [$-CH_2-$], an ethylene group [$-(CH_2)_2-$], a trimethylene group [$-(CH_2)_3-$], a tetramethylene group [$-(CH_2)_4-$], and a pentamethylene group [$-(CH_2)_5-$].

The branched chain-like aliphatic hydrocarbon group has preferably 2 to 10 carbon atoms, more preferably 2 to 6 carbon atoms, still more preferably 2 to 4 carbon atoms, and most preferably 2 or 3 carbon atoms. As the branched chain-like aliphatic hydrocarbon group, a branched chain-like alkylene group is preferable, and specific examples thereof include alkylalkylene groups, for example, alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$, and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$, and $-C(CH_2CH_3)_2-CH_2-$; alkyltrimethylene groups such as $-CH(CH_3)CH_2CH_2-$ and $-CH_2CH(CH_3)CH_2-$; and alkyltetramethylene groups such as $-CH(CH_3)CH_2CH_2CH_2-$ and $-CH_2CH(CH_3)CH_2CH_2-$. As the alkyl group in the alkylalkylene group, a linear alkyl group having 1 to 5 carbon atoms is preferable.

Examples of the aliphatic hydrocarbon group having a ring in the structure thereof include an alicyclic hydrocarbon group (a group in which two hydrogen atoms have been removed from an aliphatic hydrocarbon ring), a group in which the alicyclic hydrocarbon group is bonded to the terminal of the linear or branched chain-like aliphatic hydrocarbon group, and a group in which the alicyclic hydrocarbon group is interposed in the linear or branched aliphatic hydrocarbon group. Examples of the linear or branched chain-like aliphatic hydrocarbon group include the same groups as those described above.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane.

As the polycyclic alicyclic hydrocarbon group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The aromatic hydrocarbon group in the divalent hydrocarbon group is a hydrocarbon group having at least one aromatic ring. The aromatic ring is not particularly limited as long as the aromatic ring is a cyclic conjugated system having (4n+2) π electrons and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic heterocyclic rings in which some carbon atoms constituting the above-described aromatic hydrocarbon rings have been substituted with heteroatoms. Examples of the heteroatom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group include a group in which two hydrogen atoms have been removed from the above-described aromatic hydrocarbon ring or aromatic heterocyclic ring (an arylene group or a heteroarylene group); a group in which two hydrogen atoms have been removed from an aromatic compound having two or more aromatic rings (such as biphenyl or fluorene); and a group in which one hydrogen atom of a group (an aryl group or a heteroaryl group) obtained by removing one hydrogen atom from the above-described aromatic hydrocarbon ring or aromatic heterocyclic ring has been substituted with an alkylene group (for example, a group obtained by further removing one hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aryl group or the heteroaryl group has preferably 1 to 4 carbon atoms, more preferably 1 or 2 carbon atoms, and particularly preferably 1 carbon atom.

The divalent hydrocarbon group may have a substituent.

The linear or branched chain-like aliphatic hydrocarbon group as a divalent hydrocarbon group may or may not have a substituent. Examples of the substituent include a fluorine atom, a fluorinated alkyl group having 1 to 5 carbon atoms which has been substituted with a fluorine atom, and a carbonyl group.

The alicyclic hydrocarbon group in an aliphatic hydrocarbon group having a ring in the structure as a divalent hydrocarbon group may or may not have a substituent. Examples of the substituent include an alkyl group, an alkoxy group, a halogen atom, a halogenated alkyl group, a hydroxyl group, and a carbonyl group.

As the alkyl group as the substituent, an alkyl group having 1 to 5 carbon atoms is preferable, and a methyl group, an ethyl group, a propyl group, an n-butyl group, or a tert-butyl group is most preferable.

As the alkoxy group as the substituent, an alkoxy group having 1 to 5 carbon atoms is preferable, a methoxy group, an ethoxy group, an n-propoxy group, an iso-propoxy group, an n-butoxy group, or a tert-butoxy group is preferable, and a methoxy group or an ethoxy group is most preferable.

Examples of the halogen atom as the substituent include a fluorine atom, a chlorine atom, a bromine atom, and an iodine atom. Among these, a fluorine atom is preferable.

Examples of the halogenated alkyl group as the substituent include groups in which some or all hydrogen atoms in the above-described alkyl groups have been substituted with the above-described halogen atoms.

In the alicyclic hydrocarbon group, some carbon atoms constituting the ring structure thereof may be substituted with a substituent having a heteroatom. As the substituent having a heteroatom, —O—, —C(=O)—O—, —S—, $—S(=O)_2—$, or $—S(=O)_2—O—$ is preferable.

In the aromatic hydrocarbon group as a divalent hydrocarbon group, a hydrogen atom of the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

As the alkyl group as the substituent, an alkyl group having 1 to 5 carbon atoms is preferable, and a methyl group, an ethyl group, a propyl group, an n-butyl group, or a tert-butyl group is most preferable.

Examples of the alkoxy group, the halogen atom, and the halogenated alkyl group as the substituents include those exemplified as the substituent that substitutes a hydrogen atom in the alicyclic hydrocarbon group.

In regard to divalent linking group having heteroatom:

The heteroatom in a divalent linking group having a heteroatom is an atom other than a carbon atom and a hydrogen atom, and examples thereof include an oxygen atom, a nitrogen atom, a sulfur atom, and a halogen atom.

Preferred examples of the divalent linking group having a heteroatom include —C(=O)—O—, —C(=O)—, —O—C(=O)—O—, —C(=O)—NH—, —NH—, —NH—C(=O)—O—, —NH—C(=NH)— (H may be substituted with a substituent such as an alkyl group or an acyl group), —S—, $—S(=O)_2—$, $—S(=O)_2—O—$, and a group represented by General Formula: $—Y^{21}—O—Y^{22}—$, $—Y^{21}—O—$, $—Y^{21}—C(=O)—O—$, $—C(=O)—O—Y^{21}—$, $[Y^{21}—C(=O)—O]_{m''}—Y^{22}—$, or $—Y^{21}—O—C(=O)—Y^{22}—$ [in the formulae, $Y^{21}$ and $Y^{22}$ each independently represent a divalent hydrocarbon group which may have a substituent, O represents an oxygen atom, and m" represents an integer of 0 to 3].

In a case where the divalent linking group having a heteroatom is —C(=O)—NH—, —NH—, —NH—C(=O)—O—, —NH—, or —NH—C(=NH)—, H may be substituted with a substituent such as an alkyl group or acyl. The substituent (an alkyl group, an acyl group, or the like)

has preferably 1 to 10 carbon atoms, more preferably 1 to 8 carbon atoms, and particularly preferably 1 to 5 carbon atoms.

In Formula $—Y^{21}—O—Y^{22}—$, $—Y^{21}—O—$, $—Y^{21}—C(=O)—O—$, $—C(=O)—O—Y^{21}—$, $—[Y^{21}—C(=O)—I]_{m''}—Y^{22}—$, or $—Y^{21}—O—C(=O)—Y^{22}—$, $Y^{21}$ and $Y^{22}$ each independently represent a divalent hydrocarbon group which may have a substituent. Examples of the divalent hydrocarbon group include the same groups as "the divalent hydrocarbon groups which may have a substituent" exemplified in the section of the divalent linking group.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched chain-like aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula $—[Y^{21}—C(=O)—O]_{m}''-Y^{22}—$, m" represents an integer of 0 to 3, preferably an integer of 0 to 2, more preferably 0 or 1, and particularly preferably 1. That is, a group represented by Formula $—Y^{21}—C(=O)—O—Y^{22}—$ is preferable as the group represented by Formula $—[Y^{21}—C(=O)—O]_{m}''-Y^{22}—$. Among these, a group represented by Formula $—(CH_2)_{a'}—C(=O)—O—(CH_2)_{b'}—$ is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Among these, a glycidyl group is preferable as the epoxy group-containing group as $R^{EP}$.

In Formula (abp1), $R^{a31}$ and $R^{a32}$ each independently represent a hydrogen atom or an alkyl group having 1 to 5 carbon atoms.

The alkyl group having 1 to 5 carbon atoms as $R^{a31}$ and $R^{a32}$ is, for example, a linear, branched chain-like, or cyclic alkyl group having 1 to 5 carbon atoms. Examples of the linear or branched chain-like alkyl group include a methyl group, an ethyl group, a propyl group, an isopropyl group, an n-butyl group, an isobutyl group, a tert-butyl group, a pentyl group, an isopentyl group, and a neopentyl group, and examples of the cyclic alkyl group include a cyclobutyl group and a cyclopentyl group.

Among these, $R^{a31}$ and $R^{a32}$ represent preferably a hydrogen atom or a linear or branched chain-like alkyl group, more preferably a hydrogen atom or a linear alkyl group, and still more preferably a hydrogen atom or a methyl group.

In Formula (abp1), $na^{31}$ represents an integer of 1 to 50, preferably an integer of 4 to 50, more preferably an integer of 4 to 15, and still more preferably 5 to 8.

Preferred examples of the component (A1) include an epoxy resin having a structure represented by General Formula (a1-01) or (a1-02).

[Chemical Formula 24]

(a1-01)

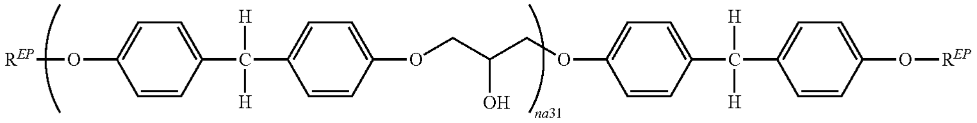

[In the formula, $R^{EP}$ represents an epoxy group-containing group, and $na^{31}$ represents an integer of 4 to 50.]

[Chemical Formula 25]

(a1-02)

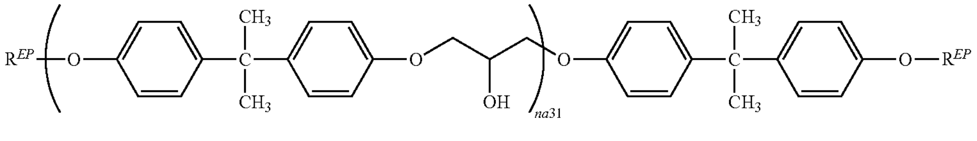

[In the formula, $R^{EP}$ represents an epoxy group-containing group, and $na^{31}$ represents an integer of 4 to 50.]

In Formulae (a1-01) and (a1-02), $R^{EP}$ represents an epoxy group-containing group and has the same definition as that for $R^{EP}$ in Formula (abp1). Among these, a glycidyl group is preferable as the epoxy group-containing group as $R^{EP}$.

In Formulae (a1-01) and (a1-02), $na^{31}$'s each independently represent an integer of 4 to 50, preferably an integer of 4 to 15, and more preferably an integer of 5 to 8.

From the viewpoint that the stress inside the cured film is easily suppressed to be low, an epoxy resin having a structure represented by General Formula (a1-01) is preferable.

From the viewpoint of further increasing the mold resistance, an epoxy resin having a structure represented by General Formula (a1-02) is preferable.

Examples of a commercially available product that can be used as the component (A1) include JER-806, JER-807, JER-4004, JER-4005, JER-4007, and JER-4010 (all manufactured by Mitsubishi Chemical Corporation), EPICLON830, EPICLON835, EPICLON860, EPICLON1050, EPICLON1051, and EPICLON1055 (all manufactured by DIC Corporation), and LCE-21 and RE-602S (all manufactured by Nippon Kayaku Co., Ltd.).

The component (A1) may be used alone or in combination of two or more kinds thereof.

The content of the component (A1) in the photosensitive composition of the present embodiment is in a range of 60 to 100 parts by mass, preferably in a range of 70 to 100 parts by mass, and more preferably in a range of 50 to 100 parts by mass with respect to the total mass (100% by mass) of the component (A).

<<(A2) Component>>

The component (A2) is an epoxy resin represented by General Formula (A2-1) which has an epoxy equivalent less than that of the component (A1). That is, a novolak type epoxy resin (Anv) is used for the component (A2).

The component (A2) may have an epoxy equivalent relatively less than the epoxy equivalent of the component (A1).

[Chemical Formula 26]

(A2-1)

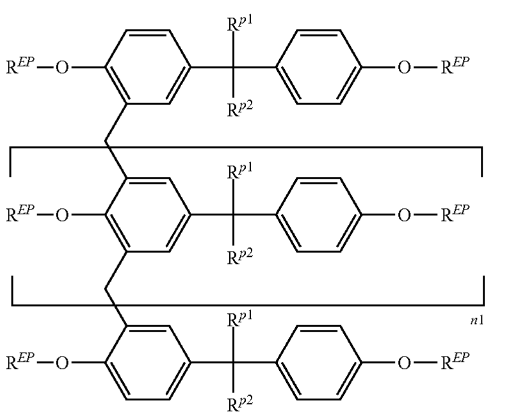

[In the formula, $R^{p1}$ and $R^{p2}$ each independently represent a hydrogen atom or an alkyl group having 1 to 5 carbon atoms, a plurality of $R^{p1}$'s may be the same as or different from each other, a plurality of $R^{p2}$'s may be the same as or different from each other, m represents an integer of 1 to 5, $R^{EP}$ represents an epoxy group-containing group, and a plurality of $R^{EP}$ 's may be the same as or different from each other.]

In Formula (A2-1), the alkyl group having 1 to 5 carbon atoms as $R^{p1}$ and $R^{p2}$ is, for example, a linear, branched chain-like or cyclic alkyl group having 1 to 5 carbon atoms. Examples of the linear or branched chain-like alkyl group include a methyl group, an ethyl group, a propyl group, an isopropyl group, an n-butyl group, an isobutyl group, a tert-butyl group, a pentyl group, an isopentyl group, and a neopentyl group, and examples of the cyclic alkyl group include a cyclobutyl group and a cyclopentyl group.

Among these, $R^{p1}$ and $R^{p2}$ represent preferably a hydrogen atom or a linear or branched chain-like alkyl group, more preferably a hydrogen atom or a linear alkyl group, and still more preferably a hydrogen atom or a methyl group.

In Formula (A2-1), a plurality of $R^{p1}$ 's may be the same as or different from each other. A plurality of $R^{p2}$ 's may be the same as or different from each other.

In Formula (A2-1), $n_1$ represents an integer of 1 to 5, preferably 2 or 3, and more preferably 2.

In Formula (A2-1), $R^{EP}$ represents an epoxy group-containing group and has the same definition as that for $R^{EP}$ in Formula (abp1). Among these, a glycidyl group is preferable as the epoxy group-containing group as $R^{EP}$.

Examples of commercially available products that can be used as the epoxy resin represented by General Formula (A2-1) include jER-152, jER-154, jER-157S70, and jER-157S65 (all manufactured by Mitsubishi Chemical Corporation).

The component (A2) may be used alone or in combination of two or more kinds thereof.

The content of the component (A2) in the photosensitive composition of the present embodiment is in a range of 15% to 60% by mass, preferably in a range of 20% to 55% by mass, and more preferably in a range of 25% to 50% by mass with respect to the total mass (100% by mass) of the component (A).

<<Other Components (A)>>

In the photosensitive composition of the present embodiment, the component (A) may contain an epoxy group-containing compound (hereinafter, also referred to as "component (A3)") in addition to the component (A1) and the component (A2).

Examples of the component (A3) include a novolak type epoxy resin (Anv) having a constitutional unit represented by General Formula (anv1).

[Chemical Formula 27]

(anv1)

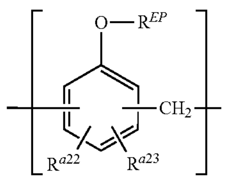

[In the formula, $R^{EP}$ represents an epoxy group-containing group, and $R^{a22}$ and $R^{a23}$ each independently represent a hydrogen atom, an alkyl group having 1 to 5 carbon atoms, or a halogen atom.]

In Formula (anv1), the alkyl group having 1 to 5 carbon atoms as $R^{a22}$ and $R^{a23}$ has the same definition as that for the alkyl group having 1 to 5 carbon atoms as $R^{p1}$ and $R^{p2}$ in Formula (A2-1). It is preferable that the halogen atom as $R^{a22}$ and $R^{a23}$ is a chlorine atom or a bromine atom.

In Formula (anv1), $R^{EP}$ has the same definition as that for $R^{EP}$ in Formula (abp1), and it is preferable that $R^{EP}$ represents a glycidyl group.

Specific examples of the constitutional unit represented by Formula (anv1) are shown below.

[Chemical Formula 28]

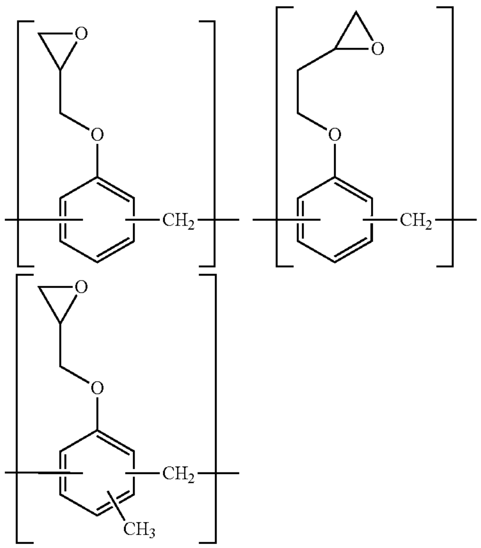

The novolak type epoxy resin (Anv) may be a resin consisting only of the constitutional unit (anv1) or a resin having the constitutional unit (anv1) and other constitutional units. Examples of other constitutional units include a constitutional unit represented by any of General Formulae (anv2) and (anv3).

[Chemical Formula 29]

(anv2)

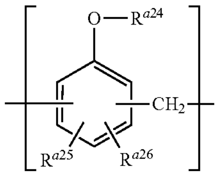

(anv3)

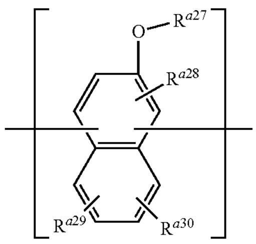

[In the formulae, $R^{a24}$ represents a hydrocarbon group which may have a substituent, $R^{a25}$, $R^{a26}$, and $R^{a28}$ to $R^{a30}$ each independently represent a hydrogen atom, an alkyl group having 1 to 5 carbon atoms, or a halogen atom, and $R^{a27}$ represents an epoxy group-containing group or a hydrocarbon group which may have a substituent.]

In Formula (anv2), $R^{a24}$ represents a hydrocarbon group which may have a substituent. Examples of the hydrocarbon group which may have a substituent include a linear or branched chain-like alkyl group and a cyclic hydrocarbon group.

The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched chain-like alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $R^{a24}$ represents a cyclic hydrocarbon group, the hydrocarbon group may be an aliphatic hydrocarbon group or an aromatic hydrocarbon group and may be a polycyclic group or a monocyclic group.

As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples thereof include adamantane, norbornane, isobornane, tricyclodecane, and tetracyclododecane.

In a case where the cyclic hydrocarbon group as $R^{a24}$ is an aromatic hydrocarbon group, the aromatic hydrocarbon group is a hydrocarbon group having at least one aromatic ring.

The aromatic ring is not particularly limited as long as the aromatic ring is a cyclic conjugated system having (4n+2) π electrons and may be monocyclic or polycyclic. The aromatic ring has preferably 5 to 30 carbon atoms, more preferably 5 to carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic heterocyclic rings in which some carbon atoms constituting the above-described aromatic hydrocarbon rings have been substituted with heteroatoms. Examples of the heteroatom in the aromatic heterocyclic rings include an oxygen atom, a sulfur atom, and a nitrogen atom. Specific examples of the aromatic heterocyclic ring include a pyridine ring and a thiophene ring.

Specific examples of the aromatic hydrocarbon group as $R^{a24}$ include a group in which one hydrogen atom has been removed from the above-described aromatic hydrocarbon ring or aromatic heterocyclic ring (such as an aryl group or a heteroaryl group); a group in which one hydrogen atom has been removed from an aromatic compound having two or more aromatic rings (such as biphenyl or fluorene); and a group in which one hydrogen atom of the above-described aromatic hydrocarbon ring or aromatic heterocyclic ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic heterocyclic ring is preferably in a range of 1 to 4, more preferably 1 or 2, and particularly preferably 1.

In Formulae (anv2) and (anv3), $R^{a25}$, $R^{a26}$, and $R^{a28}$ to $R^{a30}$ each independently represent a hydrogen atom, an alkyl group having 1 to 5 carbon atoms, or a halogen atom, and the alkyl group having 1 to 5 carbon atoms and the halogen atom each have the same definition as that for $R^{a22}$ and $R^{a23}$ described above.

In Formula (anv3), $R^{a27}$ represents an epoxy group-containing group or a hydrocarbon group which may have a substituent. The epoxy group-containing group as $R^{a27}$ has the same definition as that for $R^{EP}$ in Formula (A2-1), and the hydrocarbon group which may have a substituent as $R^{a27}$ has the same definition as that for $R^{a24}$.

Specific examples of the constitutional unit represented by any of Formulae (anv2) and (anv3) are shown below.

[Chemical Formula 30]

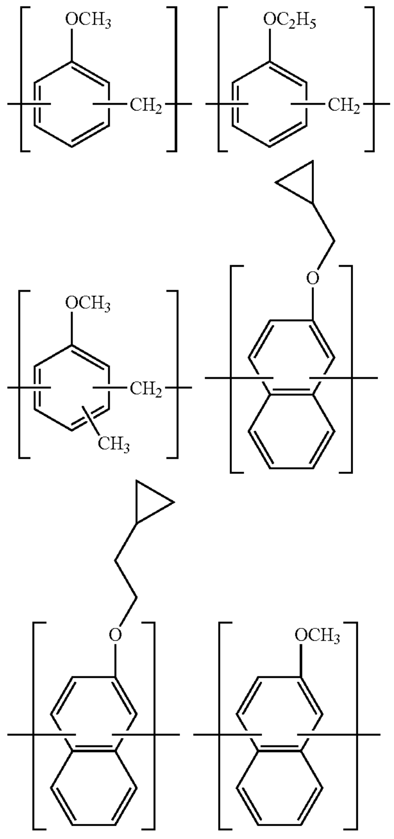

In a case where the novolak type epoxy resin (Anv) has other constitutional units in addition to the constitutional unit (anv1), the proportion of each constitutional unit in the resin (Anv) is not particularly limited, but the total amount of the constitutional unit containing an epoxy group is preferably in a range of 10% to 90% by mole, more preferably in a range of 20% to 80% by mole, and still more preferably in a range of 30% to 70% by mole with respect to the total amount of all constitutional unit s constituting the resin (Anv).

Examples of commercially available products that can be used as the above-described novolak type epoxy resins (Anv) include EPICLON N-660, EPICLON N-665, EPICLON N-670, EPICLON N-673, EPICLON N-680, EPICLON N-690, EPICLON N-695, and EPICLON HP5000 (all manufactured by DIC Corporation), EOCN-1020 (manufactured by Nippon Kayaku Co., Ltd.), and YDCN-704 (manufactured by Nippon Steel Chemical & Materials Co., Ltd.).

Further, a compound represented by Chemical Formula (A3-1) may be used as the component (A3) in addition to the resin described above. Examples of commercially available products that can be used as the compound represented by Chemical Formula (A3-1) include TECHMORE VG-3101L (manufactured by Printec, Inc.).

[Chemical Formula 31]

(A3-1)

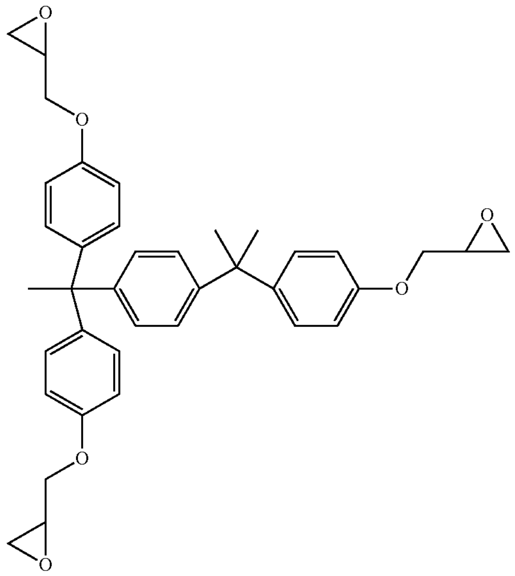

A compound represented by Chemical Formula (A3-2) may be used as the component (A3) in addition to the resin described above. Examples of commercially available products that can be used as the compound represented by Chemical Formula (A3-2) include SHOFREE (registered trademark) BATG (manufactured by Showa Denko K.K.).

[Chemical Formula 32]

(A3-2)

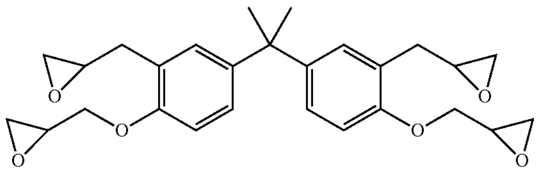

Examples of component (A3) include trimethylolpropane triglycidyl ether, glycerin triglycidyl ether, pentaerythritol tetraglycidyl ether, ditrimethylolpropane tetraglycidyl ether, diglycerin tetraglycidyl ether, erythritol tetraglycidyl ether, xylitol pentaglycidyl ether, dipentaerythritol pentaglycidyl ether, inositol pentaglycidyl ether, dipentaerythritol hexaglycidyl ether, sorbitol hexaglycidyl ether, and inositol hexaglycidyl ether.

Further, examples of the component (A3) include an aliphatic epoxy resin and an acrylic resin (Aac).

Examples of the aliphatic epoxy resin and the acrylic resin (Aac) include a resin having an epoxy group-containing unit represented by any of General Formulae (a1-1) and (a1-2).

[Chemical Formula 33]

(a1-1)

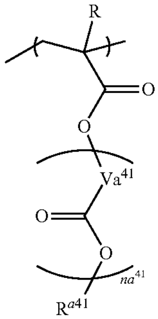

(a1-2)

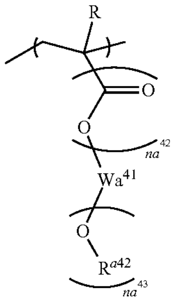

[In the formula, R represents a hydrogen atom, an alkyl group having 1 to 5 carbon atoms, or a halogenated alkyl group having 1 to 5 carbon atoms, $Va^{41}$ represents a divalent hydrocarbon group which may have a substituent, $na^{41}$ represents an integer of 0 to 2, $R^{a41}$ and $R^{a42}$ represent an epoxy group-containing group, $na^{42}$ represents 0 or 1, $Wa^{41}$ represents an ($na^{43}$+1)-valent aliphatic hydrocarbon group, and $na^{43}$ represents an integer of 1 to 3.]

In Formula (a1-1), R represents a hydrogen atom, an alkyl group having 1 to 5 carbon atoms, or a halogenated alkyl group having 1 to 5 carbon atoms.

It is preferable that the alkyl group having 1 to 5 carbon atoms as R is a linear or branched chain-like alkyl group, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms as R is a group in which some or all hydrogen atoms in the alkyl group having 1 to 5 carbon atoms have been substituted with halogen atoms. Examples of the halogen atom include a fluorine atom, a chlorine atom, a bromine atom, and an iodine atom. Among these, a fluorine atom is particularly preferable. As R, a hydrogen atom, an alkyl group having 1 to 5 carbon atoms, or a fluorinated alkyl group having 1 to 5 carbon atoms is preferable, and a hydrogen atom or a methyl group is most preferable from the viewpoint of the industrial availability.

In Formula (a1-1), $Va^{41}$ represents a divalent hydrocarbon group which may have a substituent, and examples thereof include the same groups as the divalent hydrocarbon groups which may have a substituent, described in the section of $R^{EP}$ in Formula (abp1).

Among these, as the hydrocarbon group as $Va^{41}$, an aliphatic hydrocarbon group is preferable, a linear or branched chain-like aliphatic hydrocarbon group is more preferable, a linear aliphatic hydrocarbon group is still more preferable, and a linear alkylene group is particularly preferable.

In Formula (a1-1), $na^{41}$ represents an integer of 0 to 2 and preferably 0 or 1.

In Formulae (a1-1) and (a1-2), $R^{a41}$ and $R^{a42}$ represent an epoxy group-containing group and each have the same definition as that for $R^{EP}$ in Formula (abp1).

In Formula (a1-2), an ($na^{43+1}$)-valent aliphatic hydrocarbon group as $Wa^{41}$ denotes a hydrocarbon group having no aromaticity and may be saturated or unsaturated. In general, it is preferable that the aliphatic hydrocarbon group is saturated. Examples of the aliphatic hydrocarbon group include a linear or branched chain-like aliphatic hydrocarbon group, an aliphatic hydrocarbon group having a ring in the structure thereof, and a group obtained by combining the linear or branched chain-like aliphatic hydrocarbon group and the aliphatic hydrocarbon group having a ring in the structure thereof.

In Formula (a1-2), $na^{43}$ represents an integer of 1 to 3 and preferably 1 or 2.

Specific examples of the constitutional unit represented by Formula (a1-1) or (a1-2) are shown below.

[Chemical Formula 34]

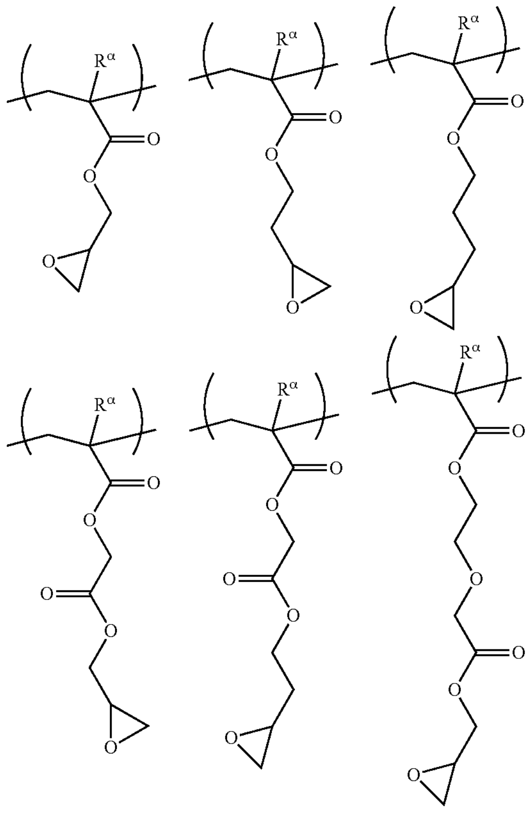

-continued
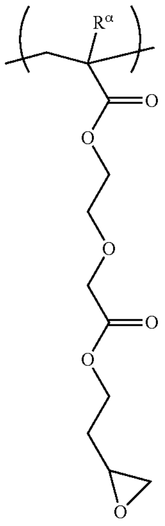
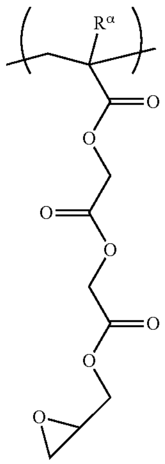
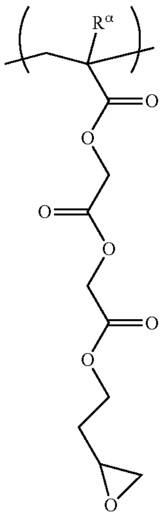
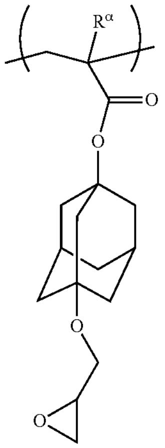
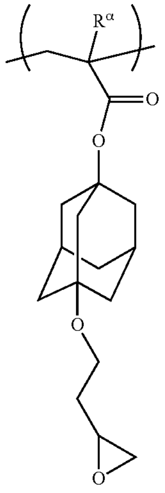
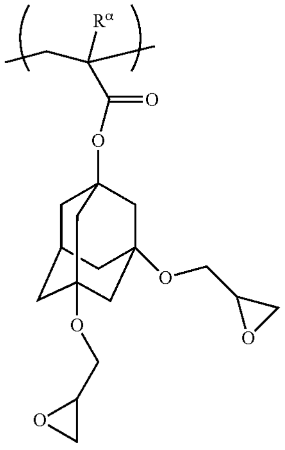
-continued
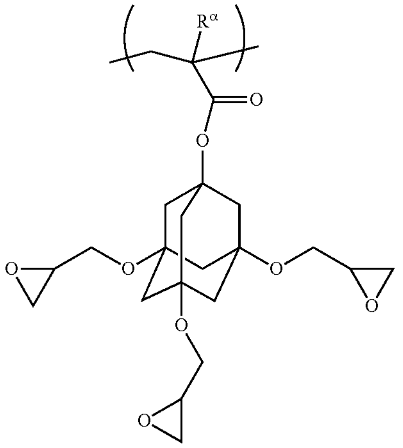
[Chemical Formula 35]
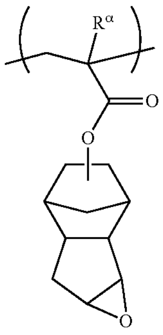
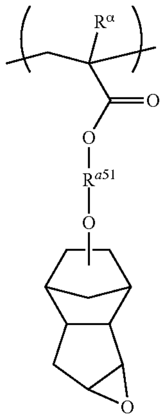
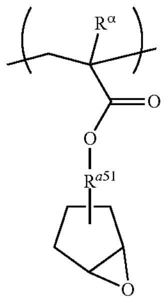
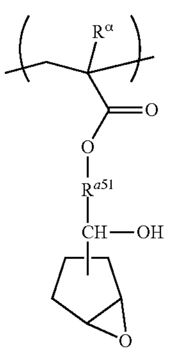
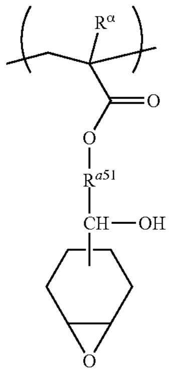
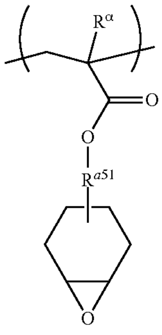

-continued
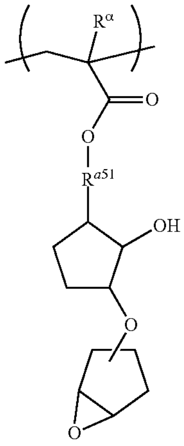
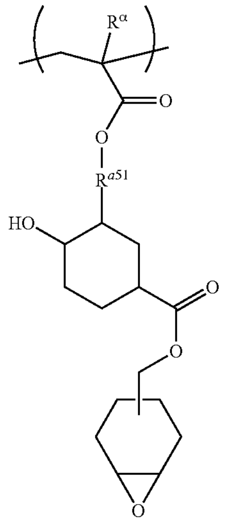
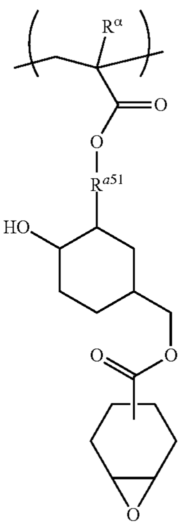
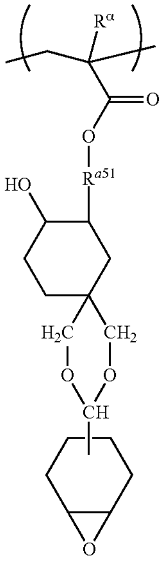
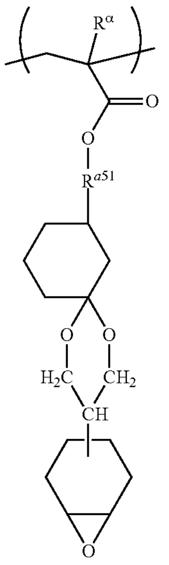
-continued
[Chemical Formula 36]
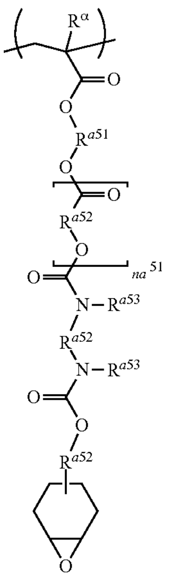
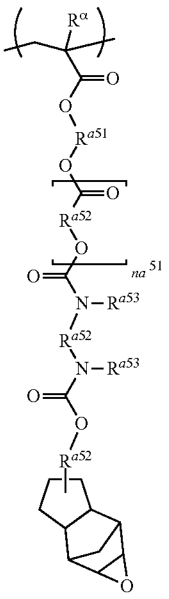
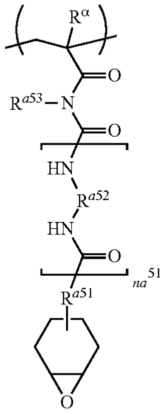
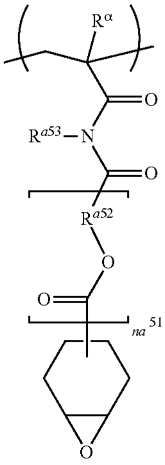
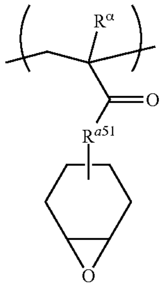
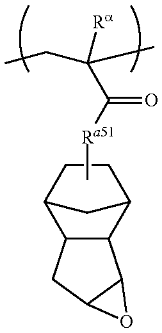
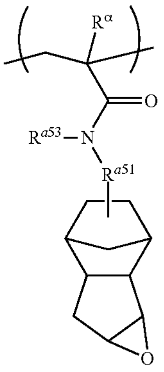
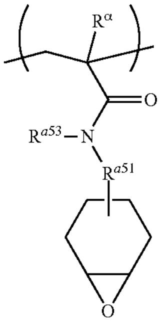
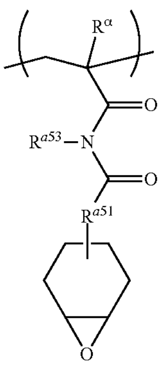

-continued

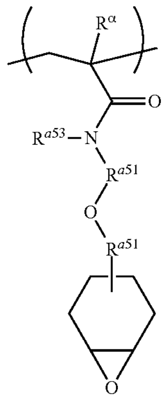

[Chemical Formula 37]

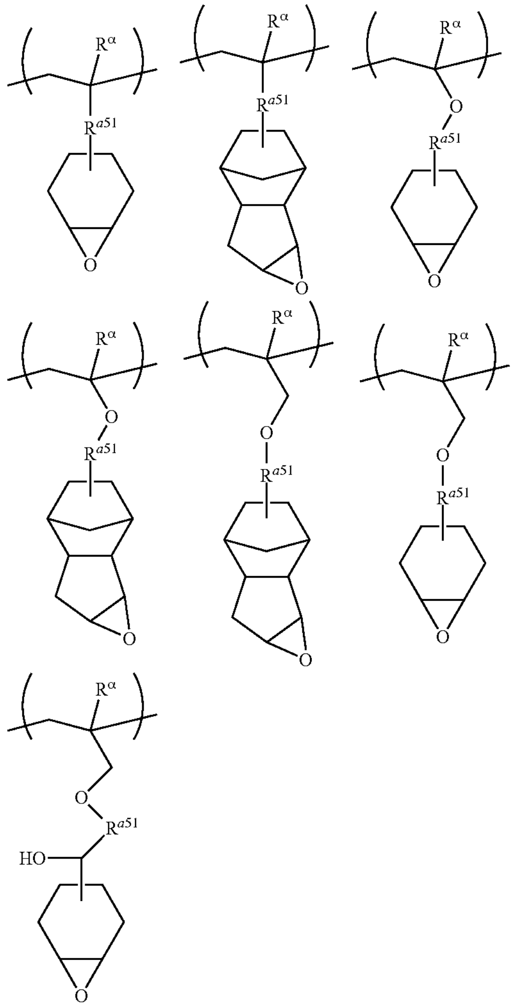

In the formulae shown above, Ra represents a hydrogen atom, a methyl group, or a trifluoromethyl group.

$R^{a51}$ represents a divalent hydrocarbon group having 1 to 8 carbon atoms. $R^{a52}$ represents a divalent hydrocarbon group having 1 to 20 carbon atoms. $R^{a53}$ represents a hydrogen atom or a methyl group. $na^{51}$ represents an integer of 0 to 10.

$R^{a51}$, $R^{a52}$, and $R^{a53}$ may be the same as or different from each other.

Furthermore, the acrylic resin (Aac) may have constitutional units derived from other polymerizable compounds for the purpose of appropriately controlling physical and chemical characteristics.

Examples of such polymerizable compounds include known radically polymerizable compounds and anionically polymerizable compounds. Examples of such polymerizable compounds include monocarboxylic acids such as acrylic acid, methacrylic acid, and crotonic acid; dicarboxylic acids such as maleic acid, fumaric acid, and itaconic acid; methacrylic acid derivatives containing a carboxyl group and an ester bond such as 2-methacryloyloxyethylsuccinic acid, 2-methacryloyloxyethylmaleic acid, 2-methacryloyloxyethylphthalic acid, and 2-methacryloyloxyethylhexahydrophthalic acid; (meth)acrylic acid alkyl esters such as methyl (meth)acrylate, ethyl (meth)acrylate, and butyl (meth)acrylates; (meth)acrylic acid hydroxy alkyl esters such as 2-hydroxyethyl (meth)acrylate and 2-hydroxypropyl (meth)acrylate; (meth)acrylic acid aryl ester such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

In a case where the aliphatic epoxy resin and the acrylic resin (Aac) have other constitutional units, the content ratio of the epoxy group-containing unit in the resin is preferably in a range of 5% to 40% by mole, more preferably in a range of 10% to 30% by mole, and most preferably in a range of 15% to 25% by mole.

Further, suitable examples of the aliphatic epoxy resins also include a compound having a partial structure represented by General Formula (m1) (hereinafter, also referred to as "component (m1)").

[Chemical Formula 38]

(m1)

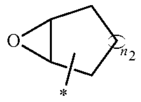

[In the formula, $n_2$ represents an integer of 1 to 4, and * represents a bonding site.]

In Formula (m1), $n_2$ represents an integer of 1 to 4, preferably an integer of 1 to 3, and more preferably 2.

Examples of the component (m1) include a compound in which a plurality of partial structures represented by General Formula (m1) are bonded via a divalent linking group or a single bond. Among these, a compound in which a plurality of partial structures represented by General Formula (m1) are bonded via a divalent linking group is preferable.

The divalent linking group here is not particularly limited, and suitable examples thereof include a divalent hydrocarbon group which may have a substituent and a divalent linking group having a heteroatom. The divalent hydrocarbon group which may have a substituent and the divalent linking group having a heteroatom each have the same definition as that for the divalent hydrocarbon group which may have a substituent and the divalent linking group having a heteroatom, described in the section of $R^{EP}$ (epoxy group-containing group) in Formula (abp1). Among the examples, a divalent linking group having a heteroatom is preferable, and a group represented by —$Y^{21}$—C(═O)—O— or a group represented by —C(═O)—O—$Y^{21}$— is more preferable. As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

Further, suitable examples of the aliphatic epoxy resin also include a compound represented by General Formula (m2) (hereinafter, also referred to as "component (m2)").

[Chemical Formula 39]

(m2)

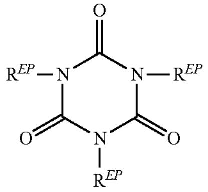

[In the formula, $R^{EP}$ represents an epoxy group-containing group, and a plurality of $R^{EP}$ 's may be the same as or different from each other.]

In Formula (m2), $R^{EP}$ represents an epoxy group-containing group and has the same definition as that for $R^{EP}$ in Formula (abp1).

Examples of commercially available products that can be used as the aliphatic epoxy resin include ADEKA RESIN EP-40805, ADEKA RESIN EP-4085S, and ADEKA RESIN EP-40885 (all manufactured by ADEKA Corporation); CELLOXIDE 2021P, CELLOXIDE2081, CELLOXIDE2083, CELLOXIDE2085, CELLOXIDE 8000, CELLOXIDE 8010, EHPE-3150, EPOLEAD PB 3600, and EPOLEAD PB 4700 (all manufactured by Daicel Corporation); DENACOL EX-211L, EX-212L, EX-214L, EX-216L, EX-321L, and EX-850L (all manufactured by Nagase ChemteX Corporation); and TEPIC-VL (manufactured by Nissan Chemical Corporation).

In a case where the component (A3) is used in combination with other components in the photosensitive composition according to the present embodiment, the content of the component (A3) is preferably 30% by mass or less, more preferably in a range of 1% to 30% by mass, still more preferably in a range of 5% to 25% by mass, and particularly preferably in a range of 5% to 20% by mass with respect to the total mass (100% by mass) of the component (A).

The content of the component (A) in the photosensitive composition of the present embodiment may be adjusted according to the film thickness of the photosensitive resin film to be formed.

For example, the content of the component (A) in the photosensitive composition of the present embodiment is preferably 80% by mass or greater, more preferably 90% by mass or greater, still more preferably 95% by mass or greater, and particularly preferably 97% by mass or greater with respect to the total mass (100% by mass) of the photosensitive composition.

In a case where the component (A1) and the component (A2) are used in a mixture in the photosensitive composition according to the present embodiment, the mixing ratio between the component (A1) and the component (A2) is preferably in a range of 25 parts by mass:75 parts by mass to 75 parts by mass:25 parts by mass. Alternatively, in a case where two kinds of components (A1) are used in the photosensitive composition according to the present embodiment, it is preferable that the mixing ratio between the components (A1) is 50 parts by mass:50 parts by mass.

<Optional Components>

The photosensitive composition used in the method for producing a hollow package according to the present embodiment may contain other components in addition to the components (A) and (I) described above, as necessary.

Miscible additives such as a metal oxide (M), a silane coupling agent, a sensitizer component, a solvent, an additional resin for improving the performance of a film, a dissolution inhibitor, a basic compound, a plasticizer, a stabilizer, a colorant, and a halation preventing agent can be appropriately added as desired to the photosensitive composition used for the method for producing a hollow package according to the present embodiment.

<<Metal Oxide (M)>>

From the viewpoint that a cured film with enhanced hardness is likely to be obtained, the photosensitive composition used for the method for producing a hollow package according to the present embodiment may further contain a metal oxide (M) (hereinafter, also referred to as "component (M)") in addition to the component (A) and the component (I). Further, in a case where the photosensitive composition contains the component (M) in combination with other components, a high-resolution pattern having a satisfactory shape can be formed.

Examples of the component (M) include oxides of metals such as silicon (metallic silicon), titanium, zirconium, and hafnium. Among these, an oxide of silicon is preferable, and silica is particularly preferable.

Further, the shape of the component (M) is preferably particulate.

As such a particulate component (M), a component consisting of a group of particles having a volume average particle diameter of 5 to 40 nm is preferable, a component consisting of a group of particles having a volume average particle diameter of 5 to 30 nm is more preferable, and a component consisting of a group of particles having a volume average particle diameter of 10 to 20 nm is still more preferable.

In a case where the volume average particle diameter of the component (M) is greater than or equal to the lower limit of the above-described preferable ranges, the hardness of the cured film is likely to be increased. Meanwhile, in a case where the volume average particle diameter of the component (M) is lower than or equal to the upper limit of the above-described preferable ranges, residues are unlikely to be generated in the formation of a pattern, and a higher-resolution pattern is likely to be formed. In addition, the transparency of the resin film is enhanced.

The particle diameter of the component (M) may be appropriately selected according to the exposure light source. In general, it is considered that particles having a particle diameter of 1/10 or less of the wavelength of light are almost not affected by light scattering. Therefore, for example, in a case where a fine structure is formed by photolithography with i-line (365 nm), it is preferable to use a group of particles having a primary particle diameter (volume average value) of 10 to 20 nm (particularly preferably, a group of silica particles) as the component (M).

The component (M) may be used alone or in combination of two or more kinds thereof.

In a case where the photosensitive composition contains the component (M), the content thereof is preferably in a range of 5 to 50 parts by mass and more preferably in a range of 10 to 40 parts by mass with respect to 100 parts by mass of the component (A).

In a case where the content of the component (M) is greater than or equal to the lower limit of the above-described preferable ranges, the hardness of the cured film is further enhanced. Meanwhile, in a case where the content of the component (M) is less than or equal to the upper limit of the above-described preferable ranges, the transparency of the resin film is further enhanced.

<<Silane Coupling Agent>>

The photosensitive composition used for the method for producing a hollow package according to the present embodiment may further contain an adhesion assistant in order to improve the adhesiveness to the substrate. A silane coupling agent is preferable as the adhesion assistant.

Examples of the silane coupling agent include silane coupling agents having reactive substituents such as a carboxy group, a methacryloyl group, an isocyanate group, and an epoxy group. Specific examples thereof include trimethoxysilylbenzoic acid, γ-methacryloxypropyltrimethoxysilane, vinyltriacetoxysilane, vinyltrimethoxysilane, γ-glycidoxypropyltrimethoxysilane, and β-(3,4-epoxycyclohexyl)ethyltrimethoxysilane.

The silane coupling agent may be used alone or in combination of two or more kinds thereof.

In a case where the photosensitive composition contains the silane coupling agent, the content thereof is preferably in a range of 0.1 to 20 parts by mass, more preferably in a range of 0.3 to 15 parts by mass, and still more preferably in a range of 0.5 to 10 parts by mass with respect to 100 parts by mass of the component (A).

In a case where the content of the silane coupling agent is in the above-described preferable ranges, the hardness of the cured film is further enhanced. In addition, the adhesiveness between the cured film and the substrate is further strengthened.

<<Sensitizer Component>>

The photosensitive composition used for the method for producing a hollow package according to the present embodiment may further contain a sensitizer component.

The sensitizer component is not particularly limited as long as the sensitizer component can absorb energy upon exposure and transmit the energy to other substances.

Specific examples of the sensitizer component include a benzophenone-based photosensitizer such as benzophenone or p,p'-tetramethyldiaminobenzophenone, a carbazole-based photosensitizer, an acetophene-based photosensitizer, a naphthalene-based photosensitizer such as 1,5-dihydroxynaphthalene, a phenol-based photosensitizer, an anthracene-based photosensitizer such as 9-ethoxyanthracene, and a known photosensitizer such as biacetyl, eosine, rose bengal, pyrene, phenothiazine, or anthrone.

The sensitizer component may be used alone or in combination of two or more kinds thereof.

In a case where the photosensitive composition contains the sensitizer component, the content thereof is preferably in a range of 0.1 to 15 parts by mass, more preferably in a range of 0.3 to 10 parts by mass, and still more preferably in a range of 0.5 to 5 parts by mass with respect to 100 parts by mass of the component (A).

In a case where the content of the sensitizer component is in the above-described preferable ranges, the sensitivity and the resolution are further enhanced.

<<Solvent>>

The photosensitive composition used for the method for producing a hollow package according to the present embodiment may further contain a solvent (hereinafter, also referred to as "component (S)").

Examples of the component (S) include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols such as ethylene glycol, diethylene glycol, propylene glycol, and dipropylene glycol; compounds having an ester bond, such as 2-methoxy butyl acetate, 3-methoxy butyl acetate, 4-methoxy butyl acetate, ethylene glycol monoacetate, diethylene glycol monoacetate, propylene glycol monoacetate, and dipropylene glycol monoacetate; polyhydric alcohol derivatives of compounds having an ether bond such as monoalkyl ether or monophenyl ether, such as monomethyl ether, monoethyl ether, monopropyl ether, or monobutyl ether of polyhydric alcohols or compounds having an ester bond [among these, propylene glycol monomethyl ether acetate (PGMEA) and propylene glycol monomethyl ether (PGME) are preferable]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene; and dimethyl sulfoxide (DMSO).

The component (S) may be used alone or in the form of a mixed solvent of two or more kinds thereof.

In a case where the photosensitive composition contains the component (S), the amount thereof used is not particularly limited, and is appropriately set according to the thickness of the coating film at a concentration at which the substrate or the like can be coated with the photosensitive composition without dripping.

For example, the component (S) can be used such that the solid content concentration is set to 50% by mass or greater, and the component (S) can be used such that the solid content concentration is 60% by mass or greater.

Further, an aspect in which the photosensitive composition does not substantially contain the component (S) (that is, an aspect in which the solid content concentration is 100% by mass) can also be employed.

The hollow package produced by the method for producing a hollow package according to the present embodiment described above includes an aluminum wire and a hollow structure.

The hollow structure of the hollow package produced by the method for producing a hallow package according to the present embodiment described above is formed of a photosensitive composition containing an anion represented by General Formula (I1-an). In General Formula (I1-an), m/(k+m) is 0 or greater and less than 0.7.

In the anion of the component (I), the halogen atom directly bonded to the heteroatom (A in the formula) is easily separated. On the contrary, in the present embodiment, the amount of the halogen atom to be separated can be reduced by using the component (I) containing an anion in which the amount of halogen atom directly bonded to the heteroatom (A in the formula) is small or zero during the formation of the hollow structure.

It is considered that the halogen atom to be separated contributes to the corrosion of the aluminum wire provided in the hollow package. In the present embodiment, since the component (I) that reduces the amount of the halogen atom to be separated is employed, a hollow package in which corrosion of the aluminum wire is suppressed can be produced.

MODIFIED EXAMPLE

In the embodiment described above, the method for producing a hollow package, including the first step and the second step has been described, but the method may further include a step of obtaining a hollow package by sealing the hollow package with a sealing material (third step) as an optional step.

As the sealing material, for example, a resin composition can be used. The resin used for the sealing material is not particularly limited as long as the resin enables at least one of sealing or insulating of the hollow structure, and examples thereof include an epoxy-based resin and a silicon-based resin.

The sealing material may contain other components such as a filler in addition to the resin.

The method of sealing the hollow structure with the sealing material is not particularly limited, and a hollow package in which a sealing material layer is provided on the hollow structure is prepared by supplying a heat-melted sealing material to the hollow structure such that the sealing material covers the hollow structure and compression-molding the sealing material.

The sealing material layer has a function of protecting the MEMS, wire parts, and the like in the hollow structure from the external environment.

In the embodiment described above, the method for producing a hollow package in which the side wall and the top plate portion are formed of the photosensitive composition has been described, but the present invention is not limited thereto. The method for producing a hollow package is not limited as long as any one of the side wall or the top plate portion is formed of the photosensitive composition.

(Method for Providing Photosensitive Composition)

In a method for providing the photosensitive composition according to the present embodiment, the photosensitive composition is provided to a process line for carrying out the method for producing a hollow package described above.

The photosensitive composition here may be prepared by being appropriately selected from the materials described above, and the preparation timing of the photosensitive composition may be determined depending on the size and the operating speed of the process line.

Further, the business entity that executes the method for producing a hollow package and the business entity that executes the method for providing the photosensitive composition are not necessarily the same as each other.

EXAMPLES

Hereinafter, the present invention will be described in more detail based on the examples, but the present invention is not limited to the following examples.

Preparation of Photosensitive Composition

Preparation Examples 1 to 5

The components listed in Table 1 were mixed, dissolved, and filtered through a PTFE filter (pore size: 1 μm, manufactured by PALL Corporation), thereby preparing a negative tone photosensitive composition (MEK solution with a solid content of approximately 84% by mass) of each preparation example.

TABLE 1

| | Component (A) | | Component (I) | | |
|---|---|---|---|---|---|
| | Component (A1) | Component (A2) | Component (I1) | Component (I3) | Other components |
| Preparation Example 1 | — | (A2)-1 [100] | (I1)-1 [0.6] | (I3)-1 [0.08] | (SC)-1 [5.0] |
| Preparation Example 2 | — | (A2)-1 [100] | (I1)-2 [0.6] | (I3)-1 [0.02] | (SC)-1 [5.0] |
| Preparation Example 3 | (A1)-1 [75] | (A2)-1 [25] | (I1)-3 [0.7] | (I3)-1 [0.02] | (SC)-1 [1.5] |
| Preparation Example 4 | (A1)-1 [50] | (A2)-1 [50] | (I1)-3 [0.5] | (I3)-1 [0.02] | (SC)-1 [1.5] |
| Preparation Example 5 | — | (A2)-1 [100] | (I1)-4 [3.0] | — | (SC)-1 [5.0] (D)-1 [1.0] |

In Table 1, each abbreviation has the following meaning. The numerical values in the brackets denote the blending amounts of the components (parts by mass; in terms of solid content).

(A1)-1: An epoxy group-containing resin represented by General Formula (A1-1), trade name "EPICLON1055", manufactured by DIC Corporation

[Chemical Formula 40]

(A1-1)

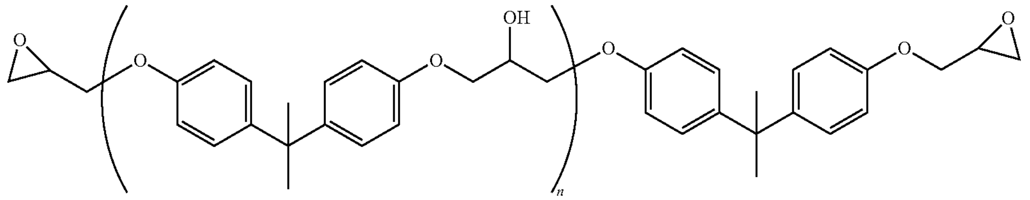

(A2)-1: A compound represented by Chemical Formula (A2-1), trade name "jER-157S70", manufactured by Mitsubishi Chemical Corporation

[Chemical Formula 41]

(A2-1)

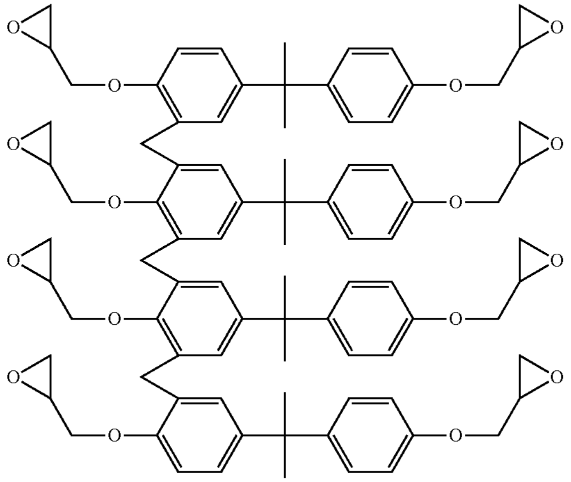

(I1)-1: A cationic polymerization initiator represented by Chemical Formula (I1-1), m/(k+m) is 0.5.

(I1)-2: A cationic polymerization initiator represented by Chemical Formula (I1-2), m/(k+m) is zero.

(I1)-3: A cationic polymerization initiator represented by Chemical Formula (I1-3) [2-tert-butyl-5-methyl-4-(2-thioxanthonylthio)phenyl](5-tert-butyl-2-methylphenyl)(2-thioxanthonyl)sulfonium tetrakis(pentafluorophenyl)borate, m/(k+m) is zero.

(I1)-4: A cationic polymerization initiator represented by Chemical Formula (I1-4), m/(k+m) is 1.

[Chemical Formula 42]

(I1-1)

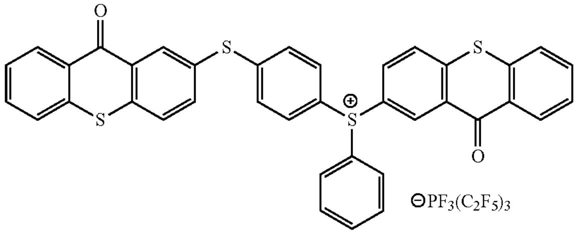

(I1-2)

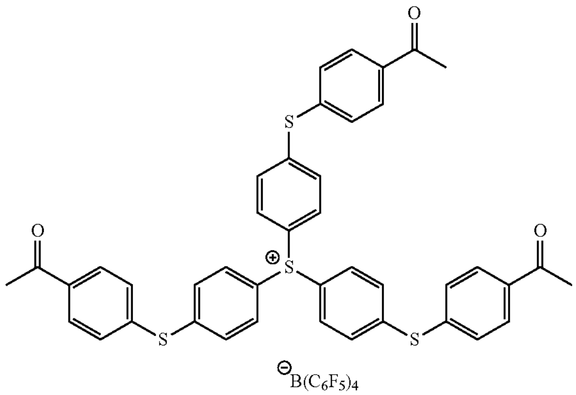

(I1-3)

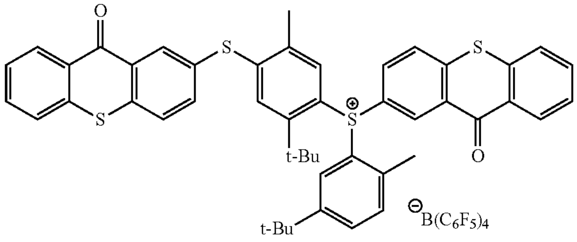

-continued (I1-4)

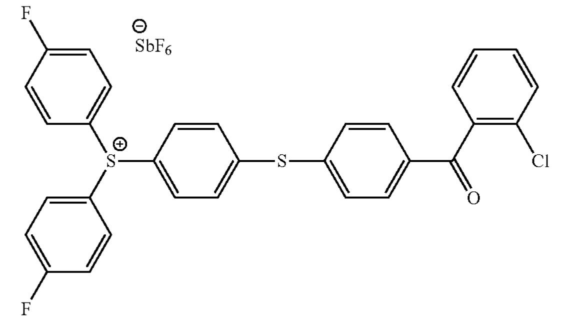

(I3)-1: A cationic polymerization initiator represented by Chemical Formula (I3-1-1)

[Chemical Formula 43]

(I3-1-1)

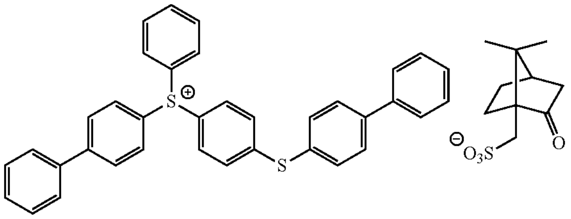

(SC)-1: A compound represented by Chemical Formula (SC-1)

(D)-1: Sensitizer, α-naphthol

[Chemical Formula 44]

(SC-1)

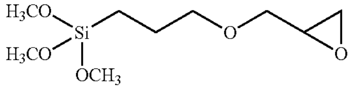

Test for Fluorine Ion Outflow Amount

Test Examples 1 to 5

A silicon-based surface release-treated PET film (trade name "A53", manufactured by Teijin Limited) was used as a base film.

Preparation of Resist Film:

The base film was coated with the negative tone photosensitive composition of each preparation example described above using an applicator and subjected to a baking treatment (PAB) in an oven at 70° C. for 10 minutes to form a photosensitive resin film, thereby obtaining a photosensitive resist film.

Preparation of Cured Product:

The above-described resist film was irradiated with ghi-line at an irradiation amount of 10000 mJ/$cm^2$. The base film was peeled off and cured by being subjected to a heat treatment in an oven, thereby obtaining a cured product.

[Evaluation of Fluorine Ion Outflow Amount]

The fluorine ion outflow amount was evaluated using the negative tone photosensitive composition of each example. 4 g of each cured product prepared by using the negative tone photosensitive compositions of Preparation Examples 1 to 5 described above and 40 g of pure water as an extraction solvent were added to a PTFE resin container provided with a lid, and the container was covered with a lid. The PTFE resin container covered with a lid was stored in a stainless steel autoclave and treated in an oven at 120° C. for 20 hours. The mixture was cooled to room temperature, the extraction liquid was collected, and the fluorine ion outflow amount was quantified by ion chromatography. The measurement results are listed in Table 2.

TABLE 2

| | Negative tone photosensitive composition | Fluorine ion outflow amount (ppm) |
|---|---|---|
| Test Example 1 | Preparation Example 1 | 5.1 |
| Test Example 2 | Preparation Example 2 | 0.1 |
| Test Example 3 | Preparation Example 3 | Not detected |
| Test Example 4 | Preparation Example 4 | Not detected |
| Test Example 5 | Preparation Example 5 | 45.4 |

As shown in the results listed in Table 2, it was confirmed that the fluorine ion outflow amount was suppressed to be low according to Test Examples 1 to 4 to which the configuration of the negative tone photosensitive composition used for the method for producing a hollow package of the present invention was applied. Among the test examples, in Test Examples 2 to 4, excellent results were obtained with respect to the fluorine ion outflow amount in the extraction liquid. In particular, in Test Examples 3 and 4, no fluoride ion was detected in the extraction liquid.

According to Test Examples 1 to 4, it was confirmed that a cured product formed of a negative tone photosensitive composition effective in suppressing outflow of fluorine was possible to provide.

Method for Producing Hollow Package

Examples 1 to 6 and Comparative Examples 1 and 2

A silicon-based surface release-treated PET film (trade name "A53", manufactured by Teijin Limited) was used as a base film.

Example 1

[First Step]: S1

A side wall surrounding the aluminum wire was formed on the substrate having the aluminum wire by performing the film forming step, the exposing step, and the developing step described below.

[[Film Forming Step]]: S11

First, an aluminum layer (Al layer) having a film thickness 150 nm was formed on a silicon wafer by using a metal thin film forming device PMC800-2MS (manufactured by Shincron Co., Ltd.) to prepare an aluminum deposition substrate, thereby obtaining a support.

The support was coated with the negative tone photosensitive composition of Preparation Example 1 using an applicator, the base film was coated with the composition using an applicator, and the support was subjected to a baking treatment (PAB) in an oven at 70° C. for 10 minutes to form a photosensitive resin film having a film thickness of 20 μm, thereby obtaining a photosensitive resist film.

A photosensitive resin film formed of the negative tone photosensitive composition of Preparation Example 1 and a silicon wafer on which aluminum was deposited were laminated under conditions of 80° C., 0.3 MPa, and 0.5 m/min such that the film thickness thereof reached 20 μm.

[[Exposing Step]]: S12

The base film in contact with the photosensitive resin film having a film thickness of 20 μm was peeled off, and the photosensitive resin film was irradiated with ghi-line at an irradiation amount of 300 $mJ/cm^2$ using a Canon PLA-501 ghi-line aligner. Thereafter, the film was subjected to a heat treatment on a hot plate at 90° C. for 5 minutes.

[[Developing Step]]: S13

The photosensitive resin film which had been subjected to the heat treatment was puddle-developed at 23° C. using propylene glycol monomethyl ether acetate as a developing solution to form a negative tone pattern serving as the side wall on the silicon wafer.

The negative tone pattern was further cured by being subjected to a heat treatment in an oven, thereby forming a substrate having a wall portion consisting of a cured body of the photosensitive resin film in which the side wall was formed of the negative tone photosensitive composition of Preparation Example 1.

[Second Step]: S2

A top plate portion was formed on the side wall to prepare a hollow structure accommodating the aluminum wire by performing the following steps (0) to (v).

[[Step (0)]]: S20

First, the aluminum deposition substrate having a side wall obtained in the first step was prepared.

The base film was coated with the negative tone photosensitive composition of Preparation Example 1 using an applicator and subjected to a baking treatment (PAB) in an oven at 70° C. for 10 minutes to form a photosensitive resin film having a film thickness of 45 μm, thereby obtaining a photosensitive resist film.

[[Step (i)]]: S21

The photosensitive resist film having a film thickness of 45 μm was disposed such that the surface of the photosensitive resin film of the photosensitive resist film blocked the opening surface of the side wall of the substrate having the side wall.

Thereafter, an operation of peeling off the base film from the photosensitive resin film of the photosensitive resist film was performed.

[[Step (ii)]]: S22

Next, the photosensitive resin film was irradiated with ghi-line at an irradiation amount of 300 $mJ/cm^2$ using a Canon PLA-501 ghi-line aligner.

[[Step (iii)]]: S23

The photosensitive resin film after exposure in the step (ii) was subjected to a heat treatment on a hot plate at 90° C. for 5 minutes.

[[Step (iv)]]: S24

The photosensitive resin film after the heat treatment in the step (iii) was puddle-developed at 23° C. using propylene glycol monomethyl ether acetate as a developing solution, thereby forming a negative tone pattern serving as the top plate portion.

[[Step (v)]]: S25

The negative tone pattern after the step (iv) was further cured by being subjected to a heat treatment in an oven, thereby forming a hollow structure consisting of a cured body of the photosensitive resin film in which the top plate portion was formed of the negative tone photosensitive composition of Preparation Example 1.

Example 2

A hollow structure was obtained in the same manner as in Example 1 except that the negative tone photosensitive composition of Preparation Example 1 was changed to the negative tone photosensitive composition of Preparation Example 2.

Example 3

A hollow structure was obtained in the same manner as in Example 1 except that the negative tone photosensitive composition of Preparation Example 1 used for the side wall was changed to the negative tone photosensitive composition of Preparation Example 3 and the negative tone photosensitive composition of Preparation Example 1 used for the top plate portion was changed to the negative tone photosensitive composition of Preparation Example 4.

Comparative Example 1

A hollow structure was obtained in the same manner as in Example 1 except that the negative tone photosensitive composition of Preparation Example 1 was changed to the negative tone photosensitive composition of Preparation Example 5.

Example 4

A hollow structure was obtained in the same manner as in Example 1 except that the aluminum layer formed on the silicon wafer was changed to an aluminum 1% copper alloy layer (AlCu layer).

Example 5

A hollow structure was obtained in the same manner as in Example 1 except that the negative tone photosensitive composition of Preparation Example 1 was changed to the negative tone photosensitive composition of Preparation Example 2 and the aluminum layer formed on the silicon wafer was changed to an aluminum 1% copper alloy layer (AlCu layer).

Example 6

A hollow structure was obtained in the same manner as in Example 1 except that the negative tone photosensitive composition of Preparation Example 1 used for the side wall was changed to the negative tone photosensitive composition of Preparation Example 3, the negative tone photosensitive composition of Preparation Example 1 used for the top plate portion was changed to the negative tone photosensitive composition of Preparation Example 4, and the aluminum layer formed on the silicon wafer was changed to an aluminum 1% copper alloy layer.

Comparative Example 2

A hollow structure was obtained in the same manner as in Example 1 except that the negative tone photosensitive composition of Preparation Example 1 was changed to the negative tone photosensitive composition of Preparation Example 5 and the aluminum layer formed on the silicon wafer was changed to an aluminum 1% copper alloy layer (AlCu layer).

<Evaluation of Corrosion of Aluminum Wire on Substrate>

The obtained hollow structure of each example was observed using an optical microscope, and the presence or absence of corrosion of the aluminum wire on the substrate was evaluated by the HAST test and the PCT test.

<Hast Test>

Figure 3:
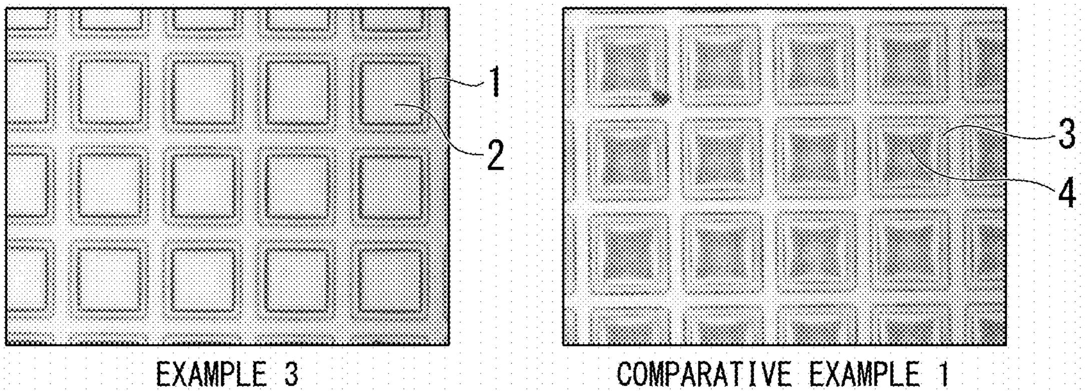
FIG. 3 is a view showing the presence or absence of corrosion after a HAST test in examples according to the present invention.

The hollow structures of Examples 1 to 3 and Comparative Example 1 were observed with an optical microscope after a HAST (85° C., humidity of 85%, 100 hours) treatment performed on the aluminum deposition substrate on which the hollow structure was formed, and the presence or absence of corrosion was observed. The results thereof are shown in FIG. 3 and Table 3.

<Pct Test>

Figure 4:
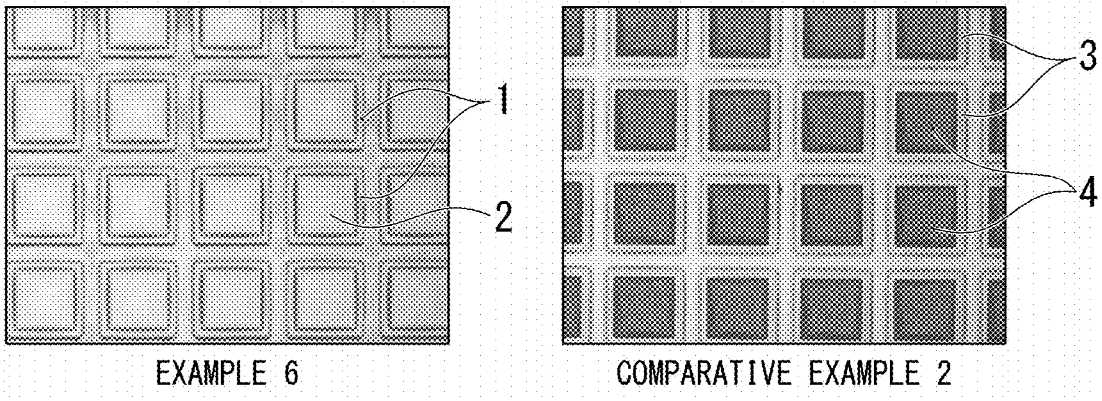
FIG. 4 is a view showing the presence or absence of corrosion after a PCT test in examples according to the present invention.

The hollow structures of Examples 4 to 6 and Comparative Example 2 were observed with an optical microscope after a PCT (120° C., 96 hours) treatment performed on the aluminum-copper 1% alloy deposition substrate on which the hollow structure was formed, and the presence or absence of corrosion was observed. The results thereof are shown in FIG. 4 and Table 4.

TABLE 3

| | Side wall | Top plate portion | Type of metal layer | Corrosion |
|---|---|---|---|---|
| Example 1 | Preparation Example 1 | Preparation Example 1 | Al layer | Not found |
| Example 2 | Preparation Example 2 | Preparation Example 2 | Al layer | Not found |
| Example 3 | Preparation Example 3 | Preparation Example 4 | Al layer | Not found |
| Comparative Example 1 | Preparation Example 5 | Preparation Example 5 | Al layer | Found |

TABLE 4

| | Side wall | Top plate portion | Type of metal layer | Corrosion |
|---|---|---|---|---|
| Example 4 | Preparation Example 1 | Preparation Example 1 | AlCu layer | Not found |
| Example 5 | Preparation Example 2 | Preparation Example 2 | AlCu layer | Not found |
| Example 6 | Preparation Example 3 | Preparation Example 4 | AlCu layer | Not found |
| Comparative Example 2 | Preparation Example 5 | Preparation Example 5 | AlCu layer | Found |

Corrosion of the metal layer was not confirmed in the hollow structures of Examples 1 to 6 to which the configuration of the present invention was applied.

FIG. 3 shows the results of photographing the state of the hollow package before and after the HAST test with an optical microscope. In Comparative Example 1, it was observed, through the top plate portion 4, that since the inside of the aluminum deposition substrate surrounded by the side wall 3 was corroded, the inside of the side wall 3 was colored black. On the contrary, in Example 3, it was observed, through the top plate portion 2, that the inside of the substrate surrounded by the side wall 1 was not corroded. The results of the internal corrosion in Examples 1 and 2 were similar to the results of Example 3.

FIG. 4 shows the results of photographing the state of the hollow package before and after the PCT test with an optical microscope. In Comparative Example 2, it was observed, through the top plate portion 4, that since the inside of the aluminum-copper 1% alloy deposition substrate surrounded by the side wall 3 was corroded, the inside of the side wall 3 was colored black. On the contrary, in Example 6, it was observed, through the top plate portion 2, that the inside of the substrate surrounded by the side wall 1 was not corroded. The results of the internal corrosion in Examples 4 and 5 were similar to the results of Example 6.

As described above, according to the examples to which the configuration of the present invention was applied, it was clarified that the corrosion of the aluminum wire provided in the hollow package was suppressed.

REFERENCE SIGNS LIST

1, 3, 20: Side wall
2, 4: Top plate portion
10: Substrate
15: Recessed portion
30: Photosensitive resin film
30A: Exposed portion
30B: Unexposed portion
30F: Photosensitive resist film
40: Cured body
60: Photomask

What is claimed is:

1. A method for producing a hollow package which includes a substrate having an aluminum wire, and a hollow structure accommodating the aluminum wire on the substrate, the method comprising:

forming a side wall that surrounds the aluminum wire on the substrate having the aluminum wire; and forming a top plate portion on the side wall and preparing the hollow structure accommodating the aluminum wire, wherein the side wall and the top plate portion are formed by a method comprising developing a photosensitive resin film formed of a negative tone photosensitive composition with an organic developing solution, the negative tone photosensitive composition consists of at least one epoxy resin selected from the group consisting of an epoxy resin having a structure represented by General Formula (abp1) and a novolak epoxy resin, a cationic polymerization initiator consisting of a cationic moiety and an anionic moiety, provided that the anionic moiety contains an anion represented by General Formula (I1-an), a solvent, and at least one member selected from the group consisting of a metal oxide, a silane coupling agent and a sensitizer, (abp1)

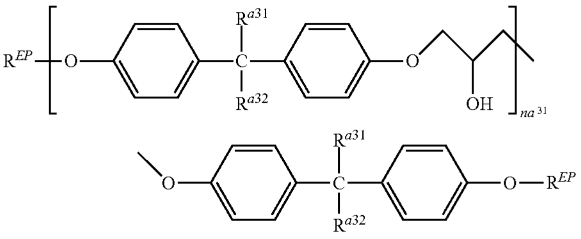

wherein $R^{EP}$ represents an epoxy group-containing group, $R^{a31}$ and $R^{a32}$ each independently represent a hydrogen atom or an alkyl group having 1 to 5 carbon atoms, and $na^{31}$ represents an integer of 1 to 50, (I1-an)

$$\left[(R)_{k} A (X)_{m}\right]^{n-}$$

wherein A represents a heteroatom selected from the group consisting of boron, aluminum, gallium, phosphorus, arsenic, antimony, and bismuth, X represents a halogen atom, R represents a monovalent organic group, k represents an integer of 1 to 6, where a plurality of R's may be linked to each other to form a divalent or higher valent organic group coordinated to A in a case where k represents 2 or greater, m represents an integer of 0 to 5, n represents an integer of 1 to 3, and m/(k+m) is 0 or greater and less than 0.7.

2. The method for producing a hollow package according to claim 1, wherein m/(k+m) in General Formula (I1-an) is less than 0.5.

3. The method for producing a hollow package according to claim 1, wherein both the side wall and the top plate portion are formed of the photosensitive composition.

4. The method for producing a hollow package according to claim 1, wherein the cationic polymerization initiator is a compound represented by General Formula (I1-1), (I1-1)

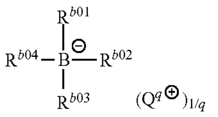

wherein $R^{b01}$ to $R^{b04}$ each independently represent an aryl group which may have a substituent, q represents an integer of 1 or greater, and $Q^{4+}$'s each independently represent a q-valent organic cation.

5. The method for producing a hollow package according to claim 1, wherein the negative tone photosensitive composition that forms the side wall and/or the top plate portion is a negative tone photosensitive composition containing the cationic polymerization initiator and an epoxy group-containing compound.

6. The method for producing a hollow package according to claim 5, wherein a content of the cationic polymerization initiator in the negative tone photosensitive composition is in a range of 0.5 to 5 parts by mass with respect to 100 parts by mass of the epoxy group-containing compound.

7. The method for producing a hollow package according to claim 1, further comprising sealing the hollow structure with a sealing material after preparing the hollow structure.

8. A method for providing a photosensitive composition, comprising providing the negative tone photosensitive composition to a process line for carrying out the method for producing a hollow package according to claim 1.

9. A method for producing a hollow package which includes a substrate having an aluminum wire, and a hollow structure accommodating the aluminum wire on the substrate, the method comprising:

forming a side wall that surrounds the aluminum wire on the substrate having the aluminum wire; and forming a top plate portion on the side wall and preparing the hollow structure accommodating the aluminum wire, wherein the side wall and/or and the top plate portion are formed from a photosensitive composition, the photosensitive composition contains a cationic polymerization initiator (I) consisting of a cationic moiety and an anionic moiety, the cationic polymerization initiator (I) comprises:

a cationic polymerization initiator (I1) in which the anion moiety is an anion represented by General Formula (I1-an), and a cationic polymerization initiator (I3) represented by General Formula (I3-1) or (I3-2), (I1)

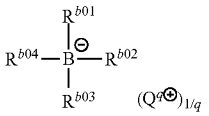

wherein Rb01 to Rb04 each independently represent an aryl group which may have a substituent or a fluorine atom, where m/(k+m), which is a relational expression between the number (m) of fluorine atoms and the number (k) of aryl groups which may have a substituent, is 0 or greater and less than 0.7, q represents an integer of 1 or greater, and Qq+'s each independently represent a q-valent organic cation $$\left[(R)_k A (X)_m\right]^{n-} \quad \text{(I1-an)}$$

wherein A represents a heteroatom selected from the group consisting of boron, aluminum, gallium, phosphorus, arsenic, antimony, and bismuth, X represents a halogen atom, R represents a monovalent organic group, k represents an integer of 1 to 6, where a plurality of R's may be linked to each other to form a divalent or higher valent organic group coordinated to A in a case where k represents 2 or greater, m represents an integer of 0 to 5, n represents an integer of 1 to 3, and m/(k+m) is 0 or greater and less than 0.7, (I3-1)

(I3-2)

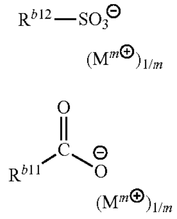

wherein Rb11 and Rb12 represent a cyclic group which may have a substituent other than a halogen atom, a chain-like alkyl group which may have a substituent other than a halogen atom, or a chain-like alkenyl group which may have a substituent other than a halogen atom, m represents an integer of 1 or greater, and each Mm+ independently represents an m-valent organic cation.

10. A method for producing a hollow package which includes a substrate having an aluminum wire, and a hollow structure accommodating the aluminum wire on the substrate, the method comprising:

forming a side wall that surrounds the aluminum wire on the substrate having the aluminum wire; and forming a top plate portion on the side wall and preparing the hollow structure accommodating the aluminum wire, wherein the side wall and/or and the top plate portion are formed by a method comprising developing a photosensitive resin film formed of a negative tone photosensitive composition with an organic developing solution, the negative tone photosensitive composition consisting of:

at least one epoxy resin selected from the group consisting of an epoxy resin having a structure represented by General Formula (abp1) and a novolak epoxy resin, a cationic polymerization initiator consisting of a cationic moiety and an anionic moiety, provided that the anionic moiety contains an anion represented by General Formula (I1-an), a solvent, and a silane coupling agent, (abp1)

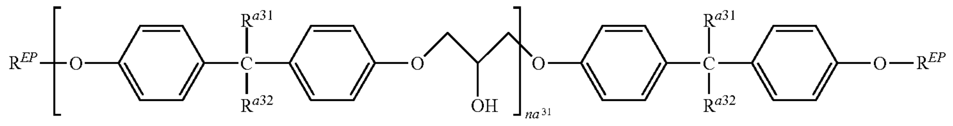

wherein $R^{EP}$ represents an epoxy group-containing group, $R^{a31}$ and $R^{a32}$ each independently represent a hydrogen atom or an alkyl group having 1 to 5 carbon atoms, and $na^{31}$ represents an integer of 1 to 50, (I1-an)

$$\left[(R)_{k} A (X)_{m}\right]^{n-}$$

wherein A represents a heteroatom selected from the group consisting of boron, aluminum, gallium, phosphorus, arsenic, antimony, and bismuth, X represents a halogen atom, R represents a monovalent organic group, k represents an integer of 1 to 6, where a plurality of R's may be linked to each other to form a divalent or higher valent organic group coordinated to A in a case where k represents 2 or greater, m represents an integer of 0 to 5, n represents an integer of 1 to 3, and m/(k+m) is 0 or greater and less than 0.7.

* * * * *